United States Patent
Grossmann et al.

(10) Patent No.: US 11,599,163 B2
(45) Date of Patent: Mar. 7, 2023

(54) HIGH-PERFORMANCE COMPUTING COOLING SYSTEM

(71) Applicant: Dell Products L.P., Round Rock, TX (US)

(72) Inventors: Philip Joseph Grossmann, Austin, TX (US); Michael James Pescetto, Round Rock, TX (US); Jacob Vick, Leander, TX (US); Travis C. North, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/243,443

(22) Filed: Apr. 28, 2021

(65) Prior Publication Data
US 2022/0350378 A1    Nov. 3, 2022

(51) Int. Cl.
*G06F 1/20* (2006.01)
*H05K 7/20* (2006.01)

(52) U.S. Cl.
CPC ............... *G06F 1/20* (2013.01); *G06F 1/206* (2013.01); *H05K 7/2039* (2013.01); *H05K 7/20172* (2013.01); *G06F 1/203* (2013.01)

(58) Field of Classification Search
CPC .... H05K 7/20172; H05K 7/2039; G06F 1/20; G06F 1/203
See application file for complete search history.

(56) References Cited

U.S. PATENT DOCUMENTS

| | | | | |
|---|---|---|---|---|
| 7,325,590 | B2* | 2/2008 | Kim | G06F 1/203 165/122 |
| 8,023,265 | B2* | 9/2011 | Yang | F04D 29/582 174/15.2 |
| 8,107,239 | B2* | 1/2012 | Fujiwara | F04D 25/068 415/203 |
| 8,964,383 | B2* | 2/2015 | Degner | G06F 1/203 361/679.48 |
| 9,778,707 | B1* | 10/2017 | San Clemente | G06F 1/182 |
| 9,845,805 | B2* | 12/2017 | Bhutani | G06F 1/20 |
| 10,969,838 | B2* | 4/2021 | He | G06F 1/203 |
| 2004/0201958 | A1* | 10/2004 | Lev | H01L 23/467 361/679.48 |
| 2005/0103477 | A1* | 5/2005 | Kim | G06F 1/203 165/104.33 |
| 2006/0078428 | A1* | 4/2006 | Zheng | F04D 29/424 415/206 |

(Continued)

*Primary Examiner* — Zachary Pape
(74) *Attorney, Agent, or Firm* — Joseph Mencher

(57) ABSTRACT

A computing cooling system includes a chassis having chassis air inlet(s) and outlet(s). Heat dissipation device(s) thermally coupled to heat producing component(s) are located in the chassis adjacent the chassis air outlet(s). A first fan device located in the chassis adjacent the chassis air inlet(s) pulls first air from outside the chassis into the first fan device via the chassis air inlet(s), and pushes the first air though the heat dissipation device(s) and out of the chassis via the chassis air outlet(s). A second fan device located in the chassis adjacent the chassis air inlet(s) pulls second air from outside the chassis into the second fan device via the chassis air inlet(s), pushes a first portion of the second air past the heat dissipation device(s) and out of the chassis via the chassis air outlet(s), and pushes a second portion of the second air into the chassis.

20 Claims, 15 Drawing Sheets

(56) References Cited

U.S. PATENT DOCUMENTS

| | | | |
|---|---|---|---|
| 2007/0086157 A1* | 4/2007 | Ruch | G06F 1/203 361/679.55 |
| 2008/0019827 A1* | 1/2008 | Hirata | G06F 1/203 415/206 |
| 2008/0074842 A1* | 3/2008 | Tracy | G06F 1/203 361/695 |
| 2008/0117594 A1* | 5/2008 | Hwang | F04D 29/424 165/104.34 |
| 2008/0151492 A1* | 6/2008 | Maddox | G06F 1/20 361/679.49 |
| 2008/0259566 A1* | 10/2008 | Fried | G06F 1/20 165/80.4 |
| 2010/0195280 A1* | 8/2010 | Huang | G06F 1/203 361/696 |
| 2012/0156063 A1* | 6/2012 | Horng | F04D 29/582 415/203 |
| 2013/0215570 A1* | 8/2013 | Huang | H05K 7/20727 361/679.47 |
| 2018/0166057 A1* | 6/2018 | Jung | G06F 1/203 |

\* cited by examiner

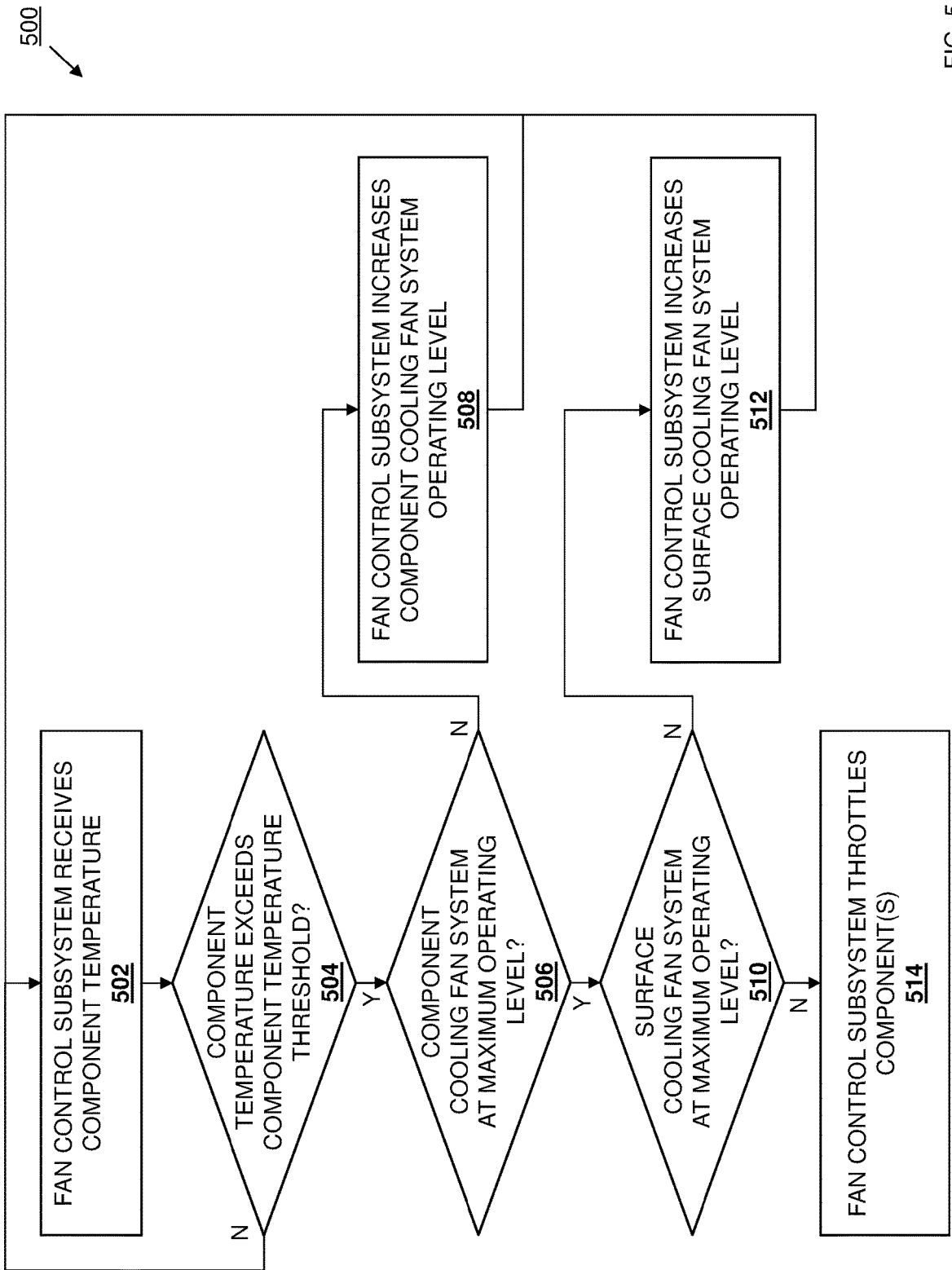

HIGH-PERFORMANCE COMPUTING COOLING SYSTEM

BACKGROUND

The present disclosure relates generally to information handling systems, and more particularly to cooling high-performance information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, laptop/notebook computing devices, may be configured to perform relatively high-performance computing operations that generate relatively high amounts of heat. For example, the rise of electronic Sports (eSports), the expansion of Massively Multi-player Online (MMO) gaming, and other gaming innovations and trends have expanded the demand for relatively high-performance gaming laptop/notebook computing devices that produce relatively high amounts of heat, and thus require advanced thermal designs that cool those laptop/notebook computing devices appropriately to ensure their operation and comfortable use. Furthermore, smaller/thinner laptop/notebook computing devices tend to differentiate a laptop/computing device platform from its competitors, but the relatively high performance/high about of heat generated by gaming laptop/notebook computing devices limit the degree to which those gaming laptop/notebook computing devices can be reduced in size due to the thermal/cooling complications that result.

Accordingly, it would be desirable to provide a high-performance computing cooling system that addresses the issues discussed above.

SUMMARY

According to one embodiment, an Information Handling System (IHS) includes a chassis; a processing system that is housed in the chassis; a memory system that is housed in the chassis and coupled to the processing system; at least one heat dissipation device that is thermally coupled to the processing system and the memory system; a first fan device that is located in the chassis and configured to: pull first air from outside the chassis into the first fan device; and push the first air past the at least one heat dissipation device and out of the chassis; and a second fan device that is located in the chassis and configured to: pull second air from outside the chassis into the second fan device; push a first portion of the second air past the at least one heat dissipation device and out of the chassis; and push a second portion of the second air into the chassis.

BRIEF DESCRIPTION OF THE DRAWINGS

FIG. 5 is a flow chart illustrating an embodiment of a method for cooling a computing device.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
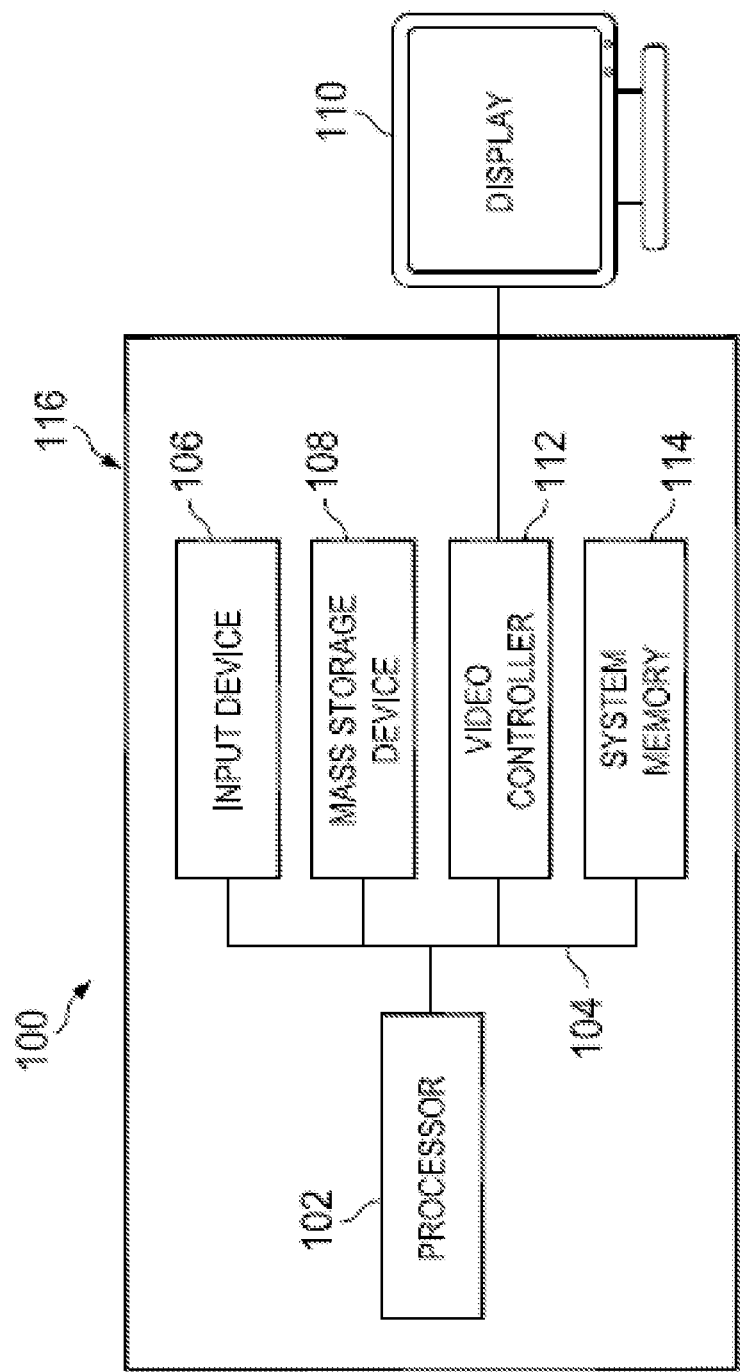
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
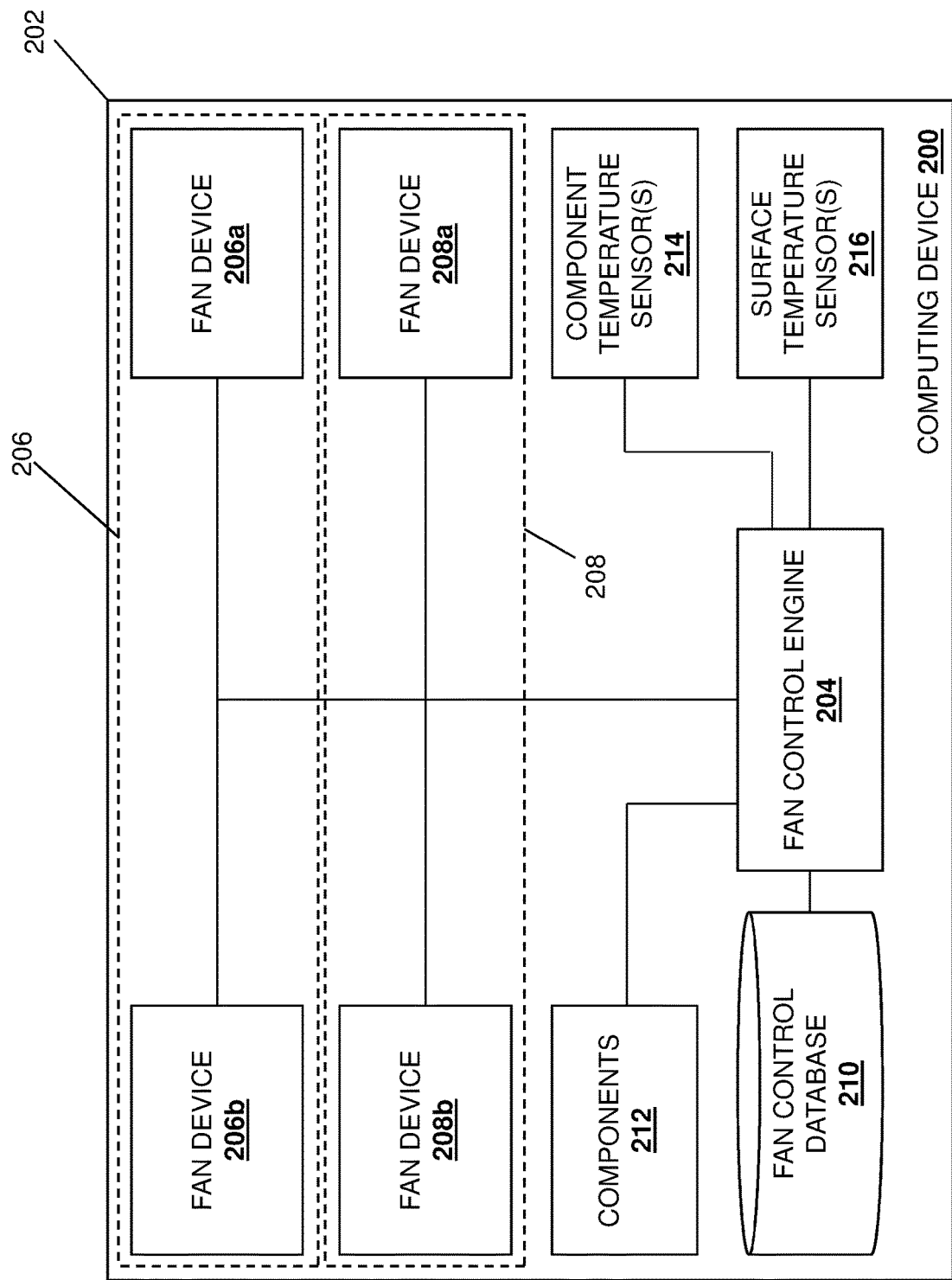
FIG. 2A is a schematic view illustrating an embodiment of a computing device that may utilize the high-performance computing cooling system of the present disclosure.
Figure 2B:
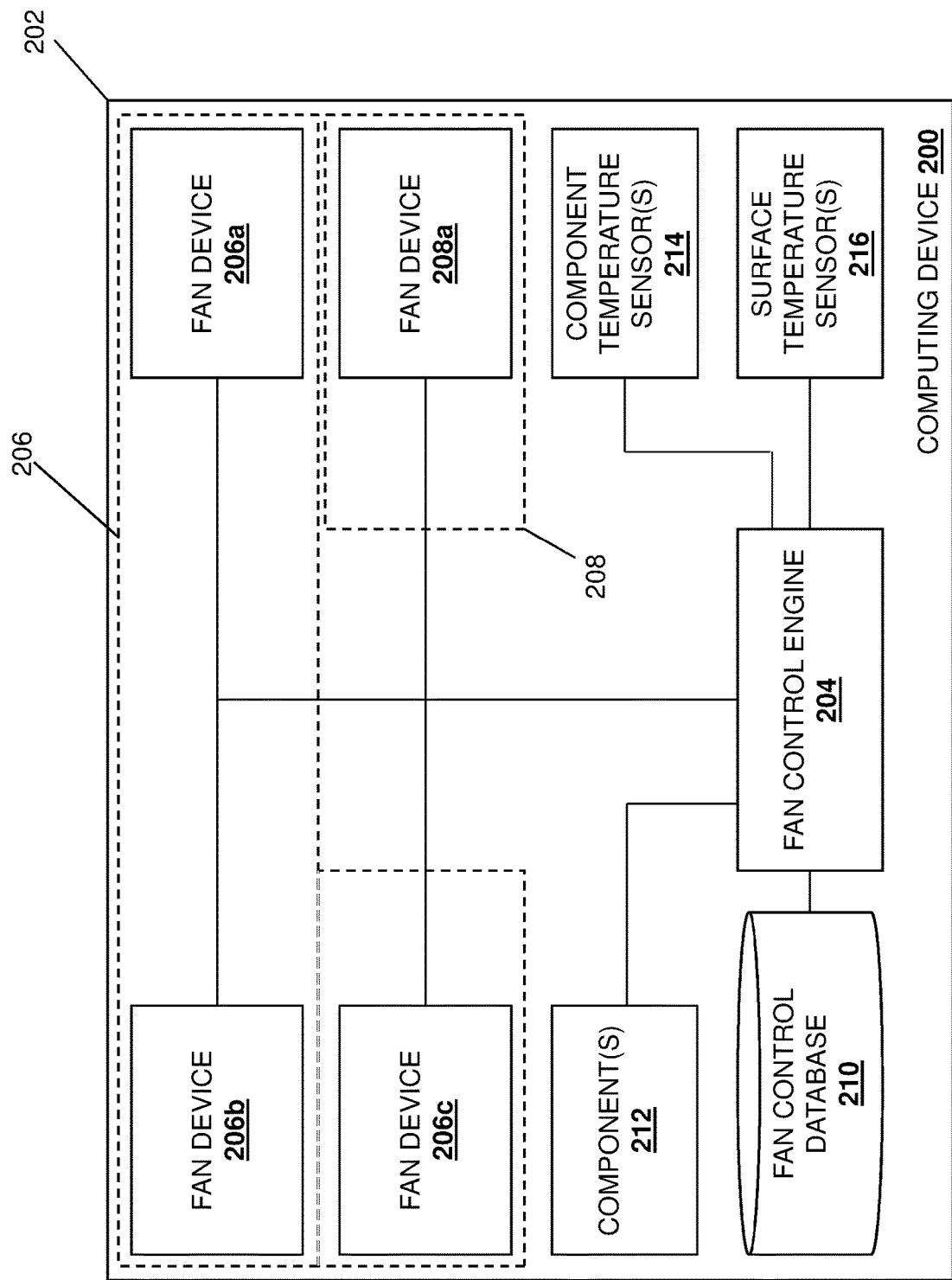
FIG. 2B is a schematic view illustrating an embodiment of a computing device that may utilize the high-performance computing cooling system of the present disclosure.

Referring now to FIGS. 2A and 2B, embodiments of a computing device 200 are illustrated that may utilize the computing cooling system of the present disclosure. In an embodiment, the computing device 200 may be provided by the IHS 100 discussed above with reference to FIG. 1 and/or may include some or all of the components of the IHS 100, and in the specific examples below is provided by a laptop/notebook computing device. However, while illustrated and discussed as being provided by a laptop/notebook computing device, one of skill in the art in possession of the present disclosure will recognize that the functionality of the computing device 300 discussed below may be provided by other computing devices that are configured to operate similarly as the computing device 200 discussed below. In the illustrated embodiment, the computing device 200 includes a chassis 202 that houses the components of the computing device 200, only some of which are illustrated below. For example, the chassis 202 may house a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to provide a fan control engine 204 that is configured to perform the functionality of the fan control engines and/or computing devices discussed below.

The chassis 202 may also house a plurality of fan systems that are illustrated and described below as including a component cooling fan system 206 and a surface cooling fan system 208 in the embodiments illustrated in FIGS. 2A and 2B. In the embodiment illustrated in FIG. 2A, the component cooling fan system 206 includes a pair of fan devices 206a and 206b that are coupled to the fan control engine 204 (e.g., via a coupling between the fan devices 206a/206b and the processing system), and the surface cooling fan system 208 includes a pair of fan devices 208a and 208b that are coupled to the fan control engine 204 (e.g., via a coupling between the fan devices 208a/208b and the processing system). In the embodiment illustrated in FIG. 2B, the component cooling fan system 206 includes three fan devices 206a, 206b, and 206c that are coupled to the fan control engine 204 (e.g., via a coupling between the fan devices 206a/206b/206c and the processing system), and the surface cooling fan system 208 includes a single fan device 208a that is coupled to the fan control engine 204 (e.g., via a coupling between the fan device 208a and the processing system). However, while two specific examples of component cooling/surface cooling fan systems are illustrated and discussed below, one of skill in the art in possession of the present disclosure will appreciate that fan systems in the computing devices may include fewer fan devices (e.g., one fan device in each of the fan systems 206 and 208) or more fan devices, and may be utilized to cool different portions of the computing device 200, while remaining within the scope of the present disclosure as well.

The chassis 202 may also house a storage system (not illustrated, but which may include the storage 108 discussed above with reference to FIG. 1) that is coupled to the fan control engine 204 (e.g., via a coupling between the storage system and the processing system) and that includes a fan control database 206 that is configured to store any of the information utilized by the fan control engine 204 discussed below. The chassis 202 may also house one or more component(s) 212 that are coupled to fan control engine 204 (via a coupling between the fan devices component(s) 212 and the processing system) and that may represent the processing system and memory system that provide fan control engine 204, as well as any other components included in the chassis 202. The chassis 202 may also with component temperature sensor(s) 214 that are coupled to fan control engine 204 (via a coupling between the component temperature sensor(s) 214 and the processing system) and that are configured to sense and report temperatures associated with the component(s) 212 (including the processing system and the memory system that provide the fan control engine 204), and surface temperature sensor(s) 216 that are coupled to fan control engine 204 (via a coupling between the surface temperature sensor(s) 216 and the processing system) and that are configured to sense and report temperatures associated with surface(s) of the chassis 202. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the functionality discussed below, while remaining within the scope of the present disclosure as well.

Figure 3:
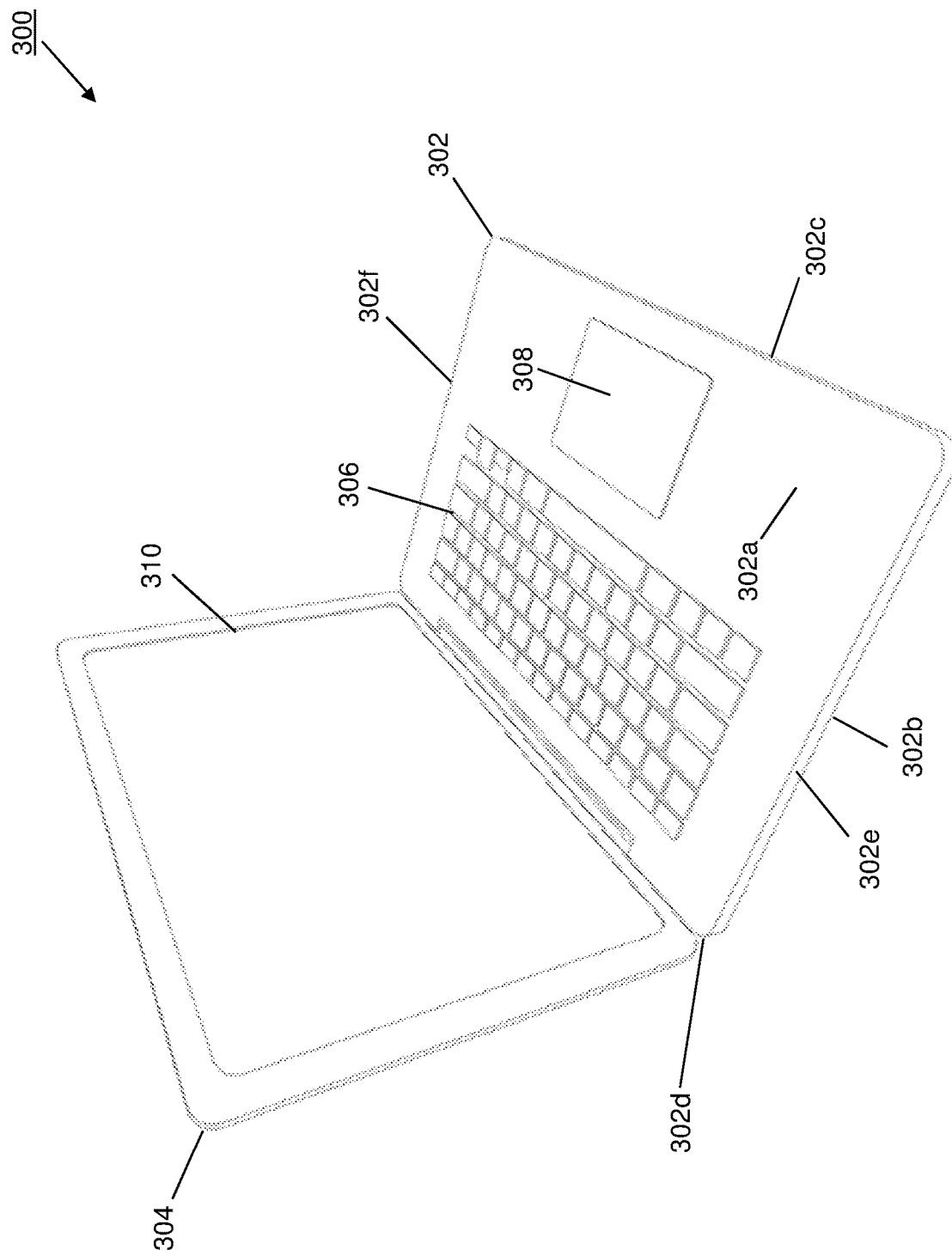
FIG. 3 is a perspective view illustrating an embodiment of the computing device of FIGS. 2A and 2B.

Referring now to FIG. 3, a laptop/notebook computing device 300 is illustrated that may provide the computing device 200 discussed above with reference to FIGS. 2A and 2B, and thus may utilize the computing cooling system of the present disclosure. In the illustrated embodiment, the laptop/notebook computing device 300 includes a chassis base portion 302 that may be moveably coupled to a chassis display portion 304 by any of a variety of laptop/notebook computing device display/base moveable couplings known in the art that allow the chassis display portion 304 to move relative to the chassis base portion 302 from the orientation illustrated in FIG. 3A and until the chassis display portion 304 and the chassis base portion 302 are positioned immediately adjacent each other. As illustrated, the chassis base portion 302 may include a top surface 302a, a bottom surface 302b that is located opposite the chassis base portion 302 from the top surface 302a, a front surface 302c that extends between the top surface 302a and the bottom surface 302b, a rear surface 302d that is located opposite the chassis base portion 302 from the front surface 302c and that extends between the top surface 302a and the bottom surface 302b, and a pair of side surfaces 302e and 302f that are located opposite the chassis base portion 302 and that extend between the top surface 302a, the bottom surface 302b, the front surface 302c, and the rear surface 302d. A keyboard 306 and a touch pad 308 are located on the top surface 302a of the chassis base portion 302, and a display 310 is included on the chassis display portion 304. While not illustrated in FIG. 3, one of skill in the art in possession of the present disclosure will appreciate that any of the surfaces 302a-302f on the chassis base portion 302 may include venting and/or other airflow apertures (e.g., defined through that surface by the chassis base portion 302, provided by a component (e.g., the keyboard 306) on the chassis base portion, etc.) that are configured to allow for the airflows discussed below.

Referring now to FIGS. 4A, 4B, 4C, 4D, 4E, and 4F, embodiments of a computing device 400 are illustrated that may be provided by the computing device 200 discussed above with reference to FIGS. 2A and 2B and/or the computing device 300 discussed above with reference to FIG. 3, and that omits different components of the computing device 400 in the different figures in order to clearly illustrated and describe the components being illustrated in those figures. As illustrated, the computing device 400 includes a chassis 402 that houses the components of the computing device 400 (only some of which are illustrated and described below), and that may be provided by the chassis 202 discussed above with reference to FIGS. 2A and 2B, and/or the chassis base portion 302 discussed above with reference to FIG. 3. For example, the chassis 402 includes a front surface 402a, a rear surface 402b, and side surfaces 402c and 402d that may be the front surface 302c, the rear surface 302d, and side surface 302e and 302f of the chassis base portion 302 discussed above with reference to FIG. 3, and one of skill in the art in possession of the present disclosure will recognize how the chassis 402 may also include a top surface that may be the top surface 302a on the chassis base portion 302 of FIG. 3 (e.g., that is located above the page and the components that are illustrated in FIGS. 4A-4F and discussed further below), and a bottom surface that may be the bottom surface 302b on the chassis base portion 302 of FIG. 3 (e.g., that is located below the page and the components that are illustrated in FIGS. 4A-4F and discussed further below), with the front surface 402a, rear surface 402b, side surfaces 402c/402d, top surface, and bottom surface defining a chassis housing 404 between them.

Figure 4A:
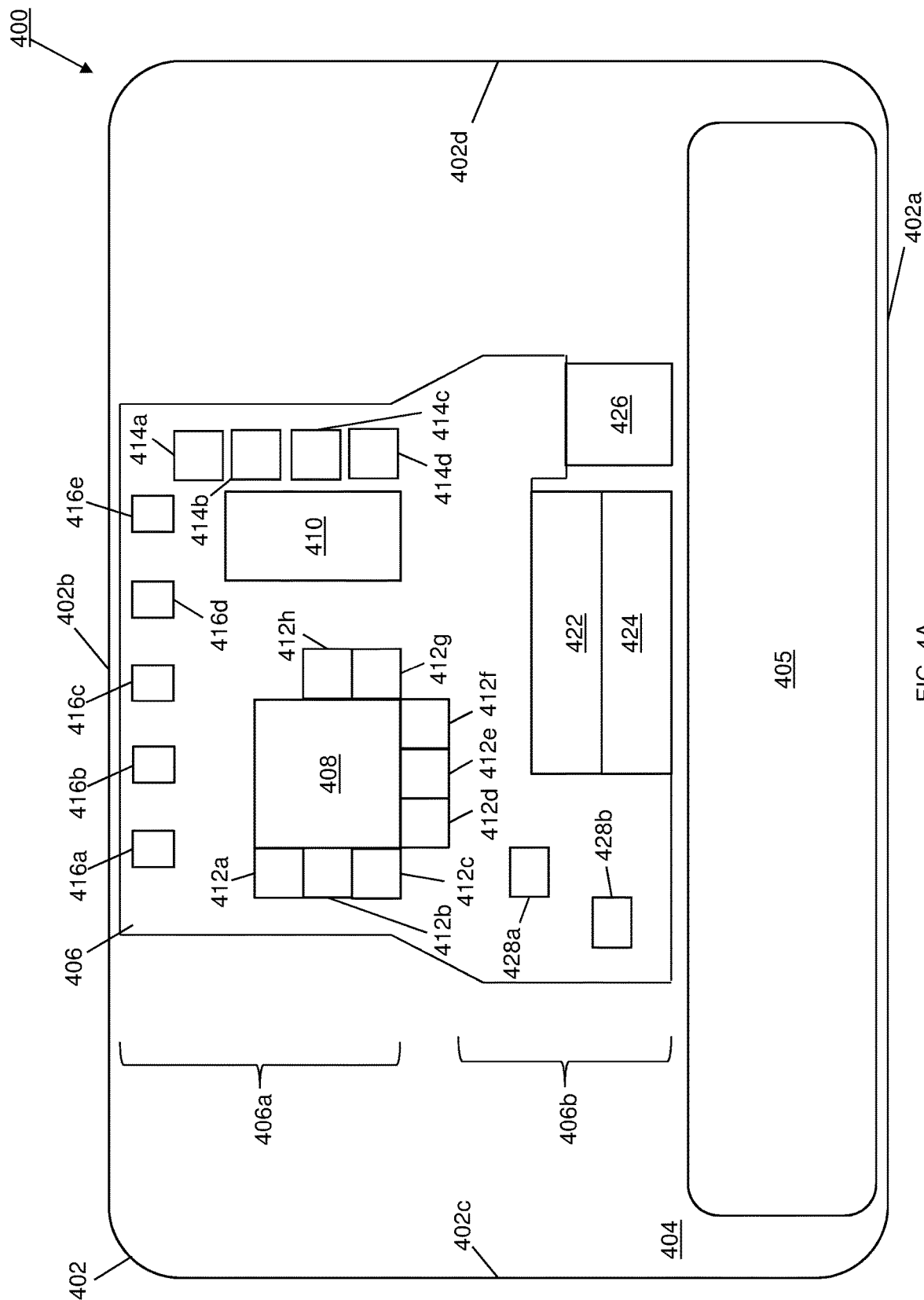
FIG. 4A is a schematic/cross-sectional view illustrating an embodiment of the computing device of FIG. 2A/2B or 3.

As illustrated in FIG. 4A, battery 405 may be included in the chassis housing 404 and may be located immediately adjacent the front surface 402a of the chassis 402. A board 406 (e.g., a motherboard 406) is included in the chassis housing 404 and located between the battery 405 and the rear surface 402b of the chassis 402. In the examples illustrated and described herein, the board 406 is provided with an "hourglass" shape in which a first portion 406a of the board 406 that includes an edge that is located adjacent the rear surface 402 of the chassis 402 includes a first width, and a second portion 406b of the board 406 that includes an edge that is located adjacent the battery 406 and that extends from the first portion of the board 406 includes a second width that is greater than the first width, with the board 406 transitioning from the first portion 406a to the second portion 406b in a manner that allows the fan systems of the present disclosure to be provided in the chassis housing 404, discussed in further detail below.

Furthermore, one of skill in the art in possession of the present disclosure will recognize how the "hourglass" board 406 orientation may be reversed from that illustrated in FIG. 4A such that the first portion 406a is adjacent the battery 405 and the second portion 406b is adjacent the rear surface 402b, which as discussed below allows the dimensions of the fan system to be modified based on cooling requirements. Further still, the shape of board 406 may be modified to provide a "lightening bolt" shape that allows a relatively larger fan device to be located on a first side of the board 406 adjacent the first portion 406a of the board 406 and a relatively smaller fan device to be located on a second side of the board 406 adjacent the first portion 406a of the board, and that allows a relatively smaller fan device to be located on the first side of the board 406 adjacent the second portion 406b of the board 406 and a relatively larger fan device to be located on the second side of the board 406 adjacent the second portion 406b of the board.

A pair of processing systems 408 and 410 are mounted to the board 406, and in the examples below the processing system 408 is provided by a graphics processing system (e.g., a Graphics Processing Unit (GPU)), while the processing system 410 is provided by a central processing system (e.g., a Central Processing Unit (CPU)). As will be appreciated by one of skill in the art in possession of the present disclosure, the processing system 410 (e.g., a CPU) in the illustrated embodiment has been "rotated" relative to conventional CPU/board placements in order to orientate the rectangularly-shaped processing system 410 in a "portrait" orientation (i.e., rather than a "landscape" orientation that would provide the processing system 410 in FIG. 4A rotated 90 degrees from its illustrated orientation), which allows for the "hourglass" shape of the board 406 with the processing systems 408 and 410 positioned side-by-side on the first portion 406a of the board 406. The inventors of the present application are unaware of any conventional computing device/board that orients a similarly rectangular-shaped processing system in a similar "portrait" orientation, and the inventors of the present application supplied that the rectangularly-shaped processing system 410 in the "portrait" orientation with supporting components, connectors, and power delivery positioned on the board 406 in a manner that takes advantage of the board area that is left available due to the "portrait" orientation of the processing system 410.

A memory system (e.g., a graphics memory system) is mounted on the first portion 406a of the board 406 and, in the illustrated embodiment, includes a plurality of memory devices 412a, 412b, 412c, 412d, 412e, 412f, 412g, and 412h that are mounted to the board 406 adjacent the processing system 408. For example, the memory devices 412a-412h may be provided by eight Graphics Double Data Rate 6 (GDDR4) memory devices that are mounted to the board 406 in a High Density Interconnect (HDI) layout that one of skill in the art in possession of the present disclosure will recognize may be provided via memory device/board manufacturing techniques that are utilize when trace widths drop below 8 mils, thus allowing a relatively higher density of memory devices on the board 406 relative to conventional memory device/board manufacturing techniques. Similarly, a memory system (e.g., a central memory system) is mounted on the first portion 406a of the board 406 and, in the illustrated embodiment, includes a plurality of memory devices 414a, 414b, 414c, and 414d that are mounted to the board 406 adjacent the processing system 410. For example, the memory devices 414a-414d may be provided by eight Dual Data Rate 4 (DDR4) memory devices that includes stacked pairs of the DDR4 memory devices that are mounted to the board 406 in an HDI layout similarly as discussed above for the memory devices 412a-412h (with the exception of the pairs of stacked memory devices 414a-414d.

As will be appreciated by one of skill in the art in possession of the present disclosure, the processing systems 408/410 and memory systems/memory devices 412a-412h/414a-414d may be oriented and positioned on the board 406 and relative to each other to minimize the board/processing system/memory system stack thickness. For example, the rotation (e.g., the "portrait" orientation of the processing system 410 discussed above) and relationship of the components on the board 406 allow for the positioning of relatively "taller" voltage regulator components at a location in the chassis housing 404 that is out of the way of the heat transfer devices/heat pipes discussed below. Furthermore, the placement of the memory devices 412a-412h and 414a-414d near the edges of the board 406 allow for the "east-west" portions of the heat transfer devices/heat pipes discussed below along with the "north/south" portions of the heat transfer devices/heat pipes discussed below that engage the heat dissipation device/heat sinks discussed below, as the relatively large size of the heat transfer devices/heat pipes discussed below requires a relatively large bend radii.

A plurality of relatively high-powered voltage regulators 416a, 416b, 416c, 416d, and 416e are mounted on the first portion 406a of the board 406 between the processing systems 408/410 and the rear surface 402b of the chassis 402, and may be connected via the board 406 to the processing systems 408/410, the memory devices 412a-h/414a-d, and/or to other relatively high-power components on the board 406. As will be appreciated by one of skill in the art in possession of the present disclosure, the voltage regulators 416a-416e may be provided by inductors, Field Effect Transistors (FETs), and capacitors that are mounted on the board 406 and configured to perform any of a variety of voltage regulator functionality known in the art.

Figure 4B:
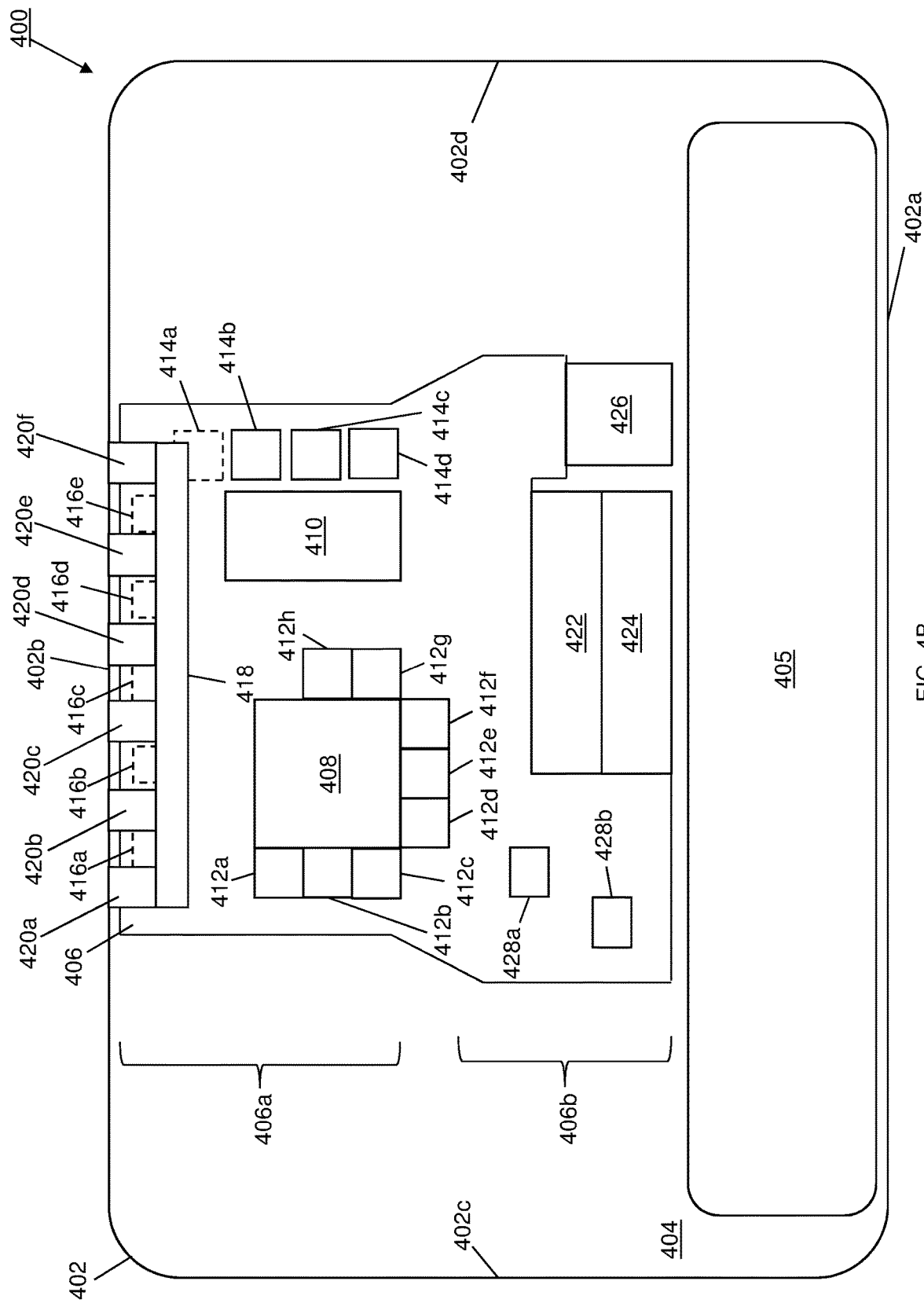
FIG. 4B is a schematic/cross-sectional view illustrating an embodiment of the computing device of FIG. 2A/2B or 3.

With reference to FIG. 4B, a daughter Input/Output (I/O) card 418 may be mounted to the board 406 in a manner that configures the daughter I/O card 418 to access the processing systems 408/410 and memory systems/memory devices 412a-h/414a-d directly (e.g., rather than through a bus), and may include a plurality of Input/Output (I/O) connectors 420a, 420b, 420c, 420d, 420e, and 420f that are located on the daughter I/O card 418 such that they are accessible via the rear surface 402b of the chassis 402 (e.g., via I/O connector apertures defined by the rear surface of the chassis 402), and connected to any of a variety of I/O components on the daughter I/O card 418 that would be apparent to one of skill in the art in possession of the present disclosure. As illustrated in FIG. 4B, the voltage regulators 416a-e and I/O connectors 420a-420f may be nested/interleaved in order to allow the co-location of the relatively taller high-powered voltage regulators 416a-416e and the I/O connectors 420a-420f. One of skill in the art in possession of the present disclosure will appreciate how the nesting of the I/O connectors 420a-420f and the voltage regulators 416a-416e (as well as the component selection and component locations in the chassis housing 404) maximizes the number of I/O ports available via the rear surface 402b the chassis 402 (particularly when the dimensions are relatively small to provide the thinner laptop/notebook computing devices discussed herein).

In some specific examples, the centrally located I/O connectors 420a-420f that are accessible on the rear surface 402b of the chassis 402 may be the only I/O connectors on the computing device 200/300/400, which one of skill in the art in possession of the present disclosure will recognize may be required in embodiments that provide the quad-fan device computing cooling system of the present disclosure. Furthermore, with reference back to FIG. 3, one of skill in the art in possession of the present disclosure will appreciate that the voltage regulators 416a-e and I/O connectors 420a-420f may be positioned in the chassis housing 404 such that they are located between the top portion of the keyboard 306 (e.g., the function keys on many conventional keyboards) and the rear surface 302d of the chassis base portion 302, which typically provides highest thickness/height allowance for components in the chassis housing 404.

In the illustrated embodiment, a pair of storage device 422 and 424 may be coupled to the second portion 406b on the board 406, and in specific examples may be provided by Solid State Drive (SSD) storage devices. Furthermore, a networking device 426 may also be coupled to the second portion 406b on the board 406, and in specific examples may be provided by Wireless Local Area Network (WLAN) networking device. A plurality of relatively low-powered voltage regulators 428a and 428b are mounted on the second portion 406b of the board 406, and may be connected via the board 406 to the storage devices 422/424, the networking device 426, and/or to other relatively low-power components on the board 406. As will be appreciate by one of skill in the art in possession of the present disclosure, the storage devices 422/424, networking device 426, and the voltage regulators 428a/428b are relatively lower temperature devices as compared to the processing systems 408/410, the memory systems/memory devices 412a-h/414a-d, and the voltage regulators 416a-416e located on the first portion 406a of the board 406. As such, the first portion 406a of the board 406 may include a variety of components are configured to operate in a first, relatively high, temperature range, and the second portion 406b of the board 406 may include a variety of components that are configured to operate in a second, relatively lower, temperature range. With reference back to FIG. 3, one of skill in the art in possession of the present disclosure will appreciate that the lower-temperature devices discussed above are positioned relatively closer to the front surface 302c of the chassis base portion 302 where the thickness/height allowance for components in the chassis housing 404 reduces and/or reaches a minimum.

Figure 4C:
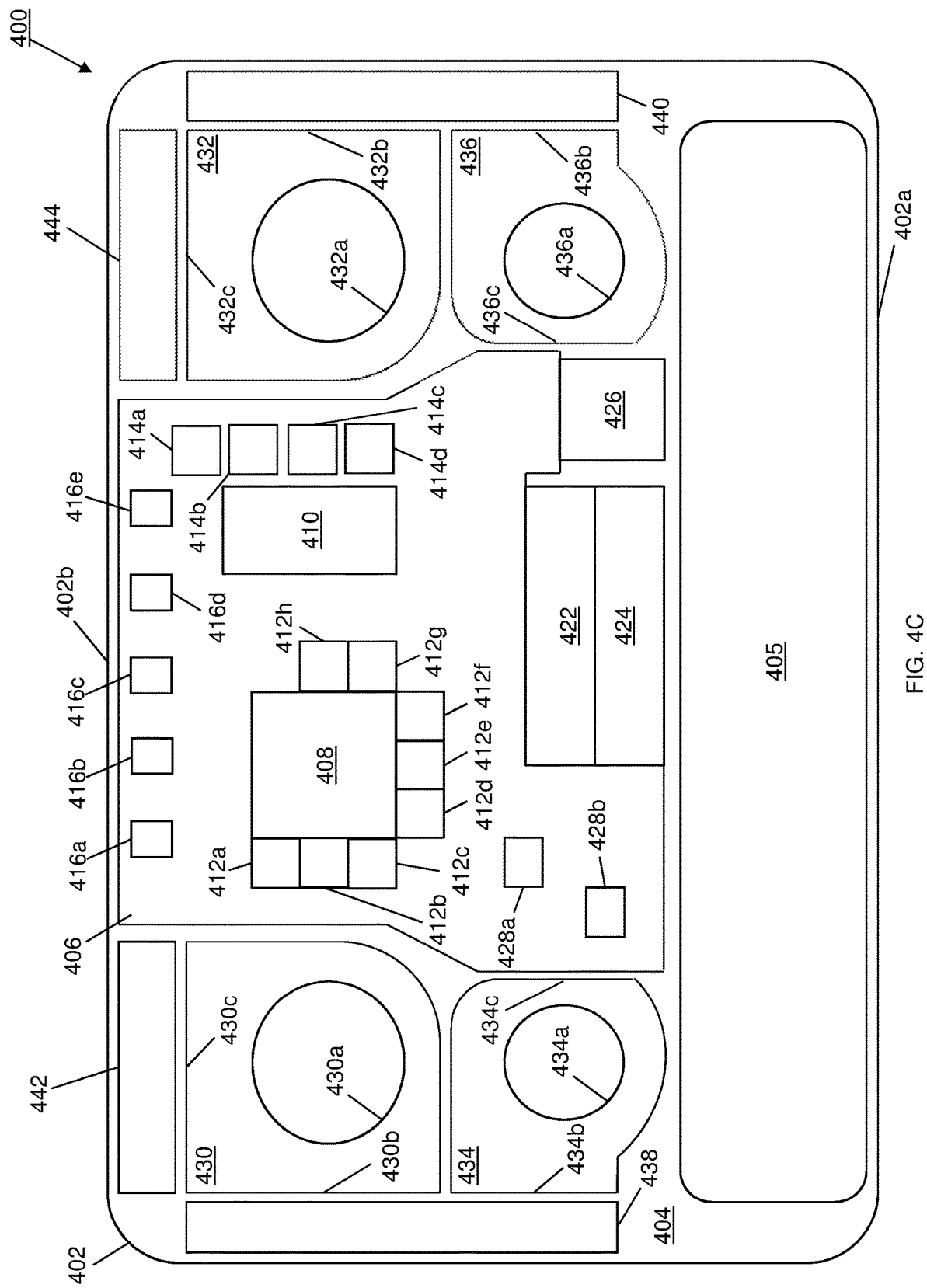
FIG. 4C is a schematic/cross-sectional view illustrating an embodiment of the computing device of FIG. 2A/2B or 3.

With reference to FIG. 4C, the chassis 402 may also house a fan device 430 that is located adjacent the rear surface 402b and the side surface 402c of the chassis 402, a fan device 432 that is located adjacent the rear surface 402b and the side surface 402d of the chassis 402, a fan device 434 that is located adjacent the side surface 402c of the chassis 402 and approximately midway between the front surface 402a and the rear surface 402b of the chassis 402, and a fan device 436 that is located adjacent the side surface 402d of the chassis 402 and approximately midway between the front surface 402a and the rear surface 402b of the chassis 402. As discussed below, in some embodiments, the chassis 402 may include a component cooling fan system provided by the fan devices 430 and 432, and a surface cooling fan system provided by the fan devices 434 and 436. In such embodiments, the fan device 430 in the component cooling fan system may be an "chassis exhaust-only fan" that includes air inlet(s) 430a that may be located adjacent venting or airflow apertures defined through the top surface and/or bottom surface of the chassis 402, an air outlet 430b adjacent the side surface 402c of the chassis 402, and an air outlet 430c adjacent the rear surface 402b of the chassis 402. In such embodiments, the fan device 432 in the component cooling fan system may also be an "chassis exhaust-only fan" that includes air inlet(s) 432a that may be located adjacent venting or airflow apertures defined through the top surface and/or bottom surface of the chassis 402, an air outlet 432b adjacent the side surface 402d of the chassis 402, and an air outlet 432c adjacent the rear surface 402b of the chassis 402.

In such embodiments, the fan device 434 in the surface cooling fan system may be an "dual-outlet-opposing fan" that includes air inlet(s) 434a that may be located adjacent venting or airflow apertures defined through the top surface and/or bottom surface of the chassis 402, an air outlet 434b adjacent the side surface 402c of the chassis 402, and an air outlet 434c in the chassis housing 404 and adjacent the second portion 406b of the board 406. In such embodiments, the fan device 436 in the surface cooling fan system may also be an "dual-outlet-opposing fan" that includes air inlet(s) 436a that may be located adjacent venting or airflow apertures defined through the top surface and/or bottom surface of the chassis 402, an air outlet 436b adjacent the side surface 402d of the chassis 402, and an air outlet 436c n the chassis housing 404 and adjacent the second portion 406b of the board 406. In an embodiment, the fan devices 434 and 436 provided by the "dual-outlet-opposing fan" in the embodiment described above may be provided as described in U.S. Pat. No. 10,584,717, issued on Mar. 10, 2020; U.S. Pat. No. 10,969,838, issued on Apr. 6, 2021; U.S. patent application Ser. No. 16/402,885, filed on May 3, 2019; U.S. patent application Ser. No. 16/575,251, filed on Sep. 18, 2019; U.S. patent application Ser. No. 16/890,590, filed on Jun. 2, 2020; the disclosures of which are incorporated herein by reference in their entirety.

Figure 4D:
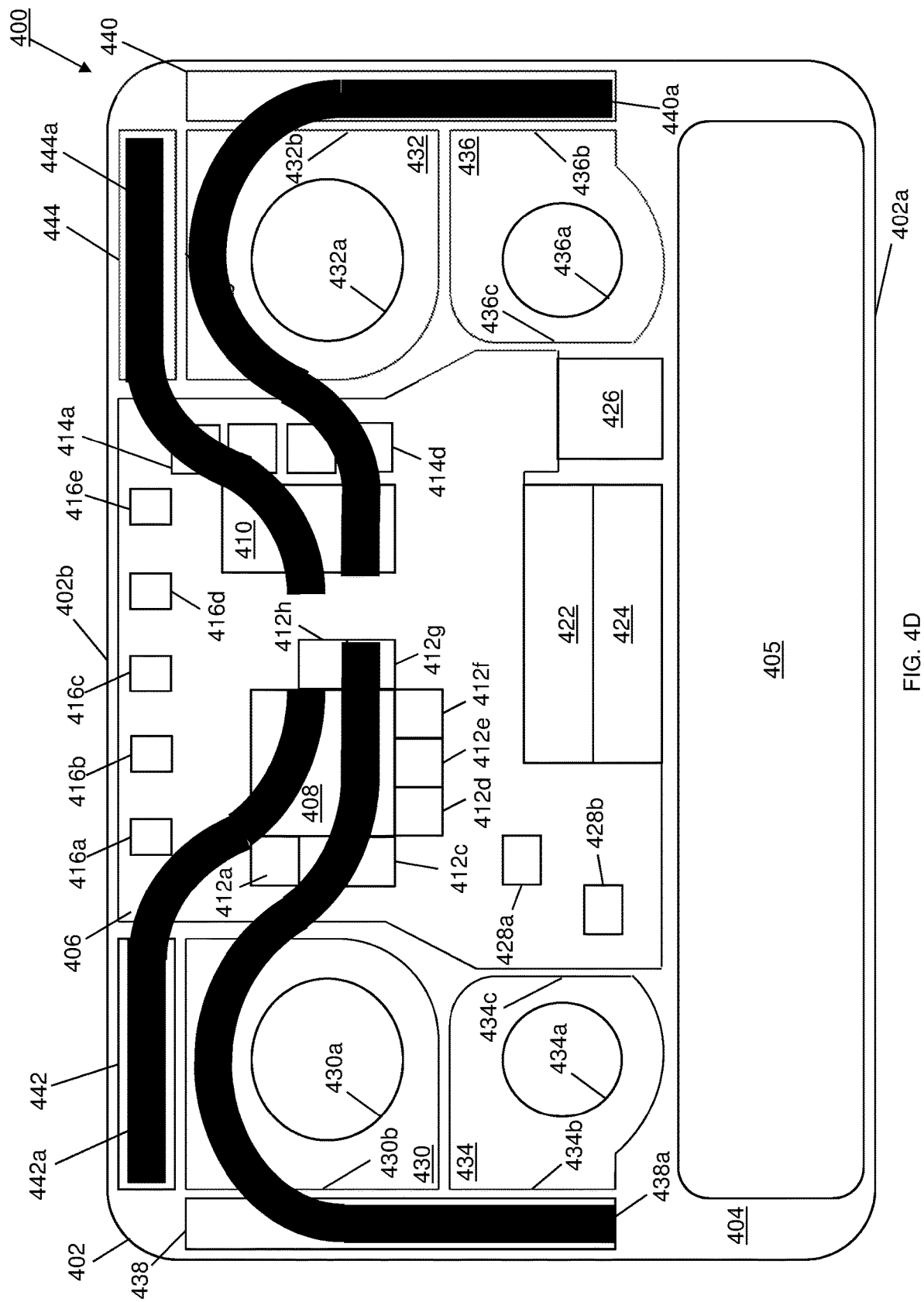
FIG. 4D is a schematic/cross-sectional view illustrating an embodiment of the computing device of FIG. 2A/2B or 3.

As also illustrated in FIGS. 4C and 4D, a heat dissipation device 438 is located in the chassis housing 404 between the air outlets 430b and 434b of the fan devices 430 and 434, respectively, and the side surface 402c of the chassis 402 (which may include venting and/or airflow apertures as discussed below), and is coupled to a heat transfer device 438a that extends from the heat dissipation device 438 and into contact with the processing system 408, one or more of the memory devices 412a-412h, and/or any other relatively high temperature components that would be apparent to one of skill in the art in possession of the present disclosure. Similarly, a heat dissipation device 440 is located in the chassis housing 404 between the air outlets 432b and 436b of the fan devices 432 and 436, respectively, and the side surface 402d of the chassis 402 (which may include venting and/or airflow apertures as discussed below), and is coupled to a heat transfer device 440a that extends from the heat dissipation device 440 and into contact with the processing system 410, one or more of the memory devices 414a-414d, and/or any other relatively high temperature components that would be apparent to one of skill in the art in possession of the present disclosure.

Similarly, a heat dissipation device 442 is located in the chassis housing 404 between the air outlet 430c of the fan device 430 and the rear surface 402b of the chassis 402 (which may include venting and/or airflow apertures as discussed below), and is coupled to a heat transfer device 442a that extends from the heat dissipation device 442 and into contact with the processing system 408, one or more of the memory devices 412a-412h, and/or any other relatively high temperature components that would be apparent to one of skill in the art in possession of the present disclosure. Similarly, a heat dissipation device 444 is located in the chassis housing 404 between the air outlet 432c of the fan device 432 and the rear surface 402b of the chassis 402 (which may include venting and/or airflow apertures as discussed below), and is coupled to a heat transfer device 444aa that extends from the heat dissipation device 444 and into contact with the processing system 410, one or more of the memory devices 414a-414d, and/or any other relatively high temperature components that would be apparent to one of skill in the art in possession of the present disclosure. In a specific example, the heat dissipation devices 438, 440, 442, and 444 may be provided by finned heat sinks, with the heat transfer devices 438a, 440a, 442a, and 44a provided by heat pipes, but one of skill in the art in possession of the present disclosure will appreciate that other heat dissipation devices and/or heat transfer devices will fall within the scope of the present disclosure as well.

Thus, as discussed in further detail below, some embodiments of the present disclosure may provide quad-fan system that includes a two-fan component cooling fan system that is provided by the fan devices 430 and 432 (e.g., "chassis exhaust-only fans") and that exhausts airflow through heat dissipation devices and out multiple surfaces of the chassis 402 to cool components in the chassis 402, while including a two-fan surface cooling fan system that is provided by the fan devices 434 and 436 (e.g., "dual-outlet-opposing fans") and that exhausts airflow into the chassis housing 404 to cool the surfaces of the chassis 402, while also exhausting airflow through some of the heat dissipation devices and out surfaces of the chassis 402 to cool components in the chassis 402 as well.

As also discussed below, in other embodiments, the chassis 402 may include a component cooling fan system provided by the fan devices 430, 432, and 434 (e.g., each provided by the "chassis exhaust-only fan" described above), and a surface cooling fan system provided by the fan device 436 (e.g., provided by the "dual-outlet-opposing fan" described above). In such embodiments, the fan devices 430, 432, and 436 may be provided substantially as described above, while the fan device 434 may be modified to remove the air outlet 434c discussed above as being located adjacent the second portion 406b of the board 406. Thus, as discussed in further detail below, some embodiments of the present disclosure may provide quad-fan system that includes a three-fan component cooling fan system that is provided by the fan devices 430, 432, and 434 (e.g., "chassis exhaust-only fans"), with the fan devices 430 and 432 exhausting airflow through heat dissipation devices and out multiple surfaces of the chassis 402 and the fan device 434 exhausting airflow through a heat dissipation device and out a surface of the chassis 402 to cool components in the chassis 402, while including a single-fan surface cooling fan system that is provided by the fan device 436 (e.g., a "dual-outlet-opposing fan") that exhausts airflow into the chassis housing 404 to cool the surfaces of the chassis 402, while also exhausting airflow through a heat dissipation device and out a surface of the chassis 402 to cool components in the chassis 402 as well.

However, while two specific quad-fan device embodiments are illustrated and described, one of skill in the art in possession of the present disclosure will appreciate that different numbers of fan devices may be provided while remaining within the scope of the present disclosure. For example, some embodiments of the present disclosure may provide two-fan system that includes a single-fan component cooling fan system that may be provided by the fan device 432 that exhausts airflow through heat dissipation devices and out multiple surfaces of the chassis 402 to cool components in the chassis 402, while including a single-fan surface cooling fan system that may be provided by the fan device 436 that exhausts airflow into the chassis housing 404 to cool the surfaces of the chassis 402, while also exhausting airflow through a heat dissipation device and out a surface of the chassis 402 to cool components in the chassis 402 as well. As such, one of skill in the art in possession of the present disclosure will appreciate how cooling requirements for components and surfaces on the computing devices 200, 300 and 400 discussed above may different, and the number of fan devices utilized in the computing cooling systems of the present disclosure may be adjusted to satisfy those cooling requirements.

In experimental embodiments, the "hourglass" shape of the board 406 was determined by calculating the volume of the chassis housing 404 required to house the fan devices 430, 432, 434, and 436 when those fan devices 430, 432, 434, and 436 were provided with x-y-z dimensions and size ratios that produced the most efficient airflow for the computing device 400, and the components on the board 406 were then positioned on the board 406 based on the projected heat generation and the airflow produced by the fan devices 430, 432, 434, and 436. In a specific example, the size ratio of the fan devices 430 and 432 to the fan devices 434 and 436 was approximately 93 mm×95 mm-to-70 mm×70 mm (1.33-to-1) in order to provide efficient airflow for the components utilized on the board 406 in a chassis with a 17" display device (e.g., the chassis base portion 302 with the chassis display portion 304 having the display device 310 in FIG. 3), but one of skill in the art in possession of the present disclosure will recognize how that size ratio may change in different sized chassis using different component.

Figure 4E:
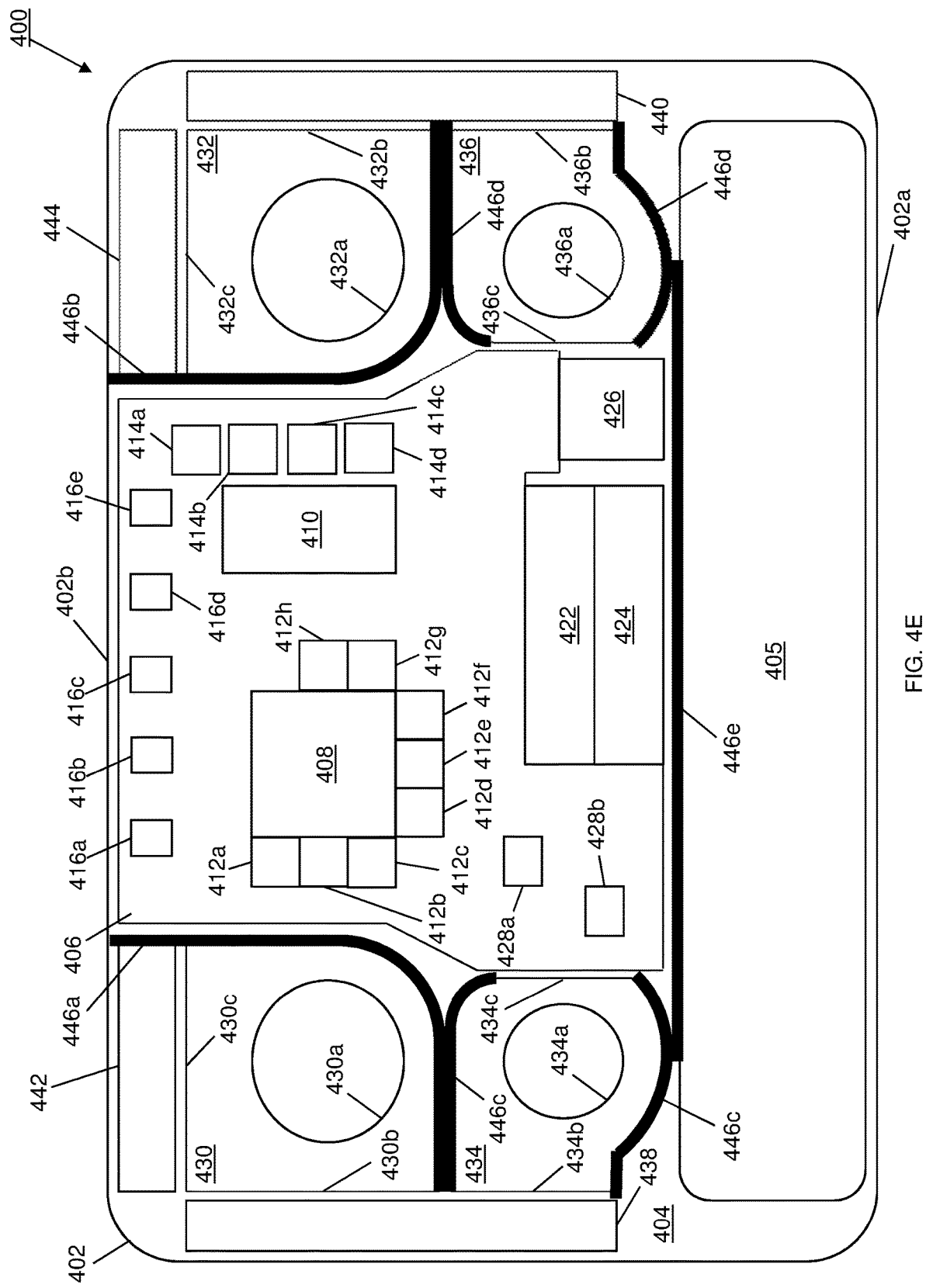
FIG. 4E is a schematic/cross-sectional view illustrating an embodiment of the computing device of FIG. 2A/2B or 3.

With reference to FIG. 4E, an embodiment of a gasketing system is illustrated that may be utilized with the quad-fan system embodiment discussed above that includes a two-fan component cooling fan system provided by the fan devices 430 and 432, and a two-fan surface cooling fan system that is provided by the fan devices 434 and 436. In the example illustrated in FIG. 4E, the gasketing system includes a gasketing subsystem 446a that seals the air inlet(s) 430a and air outlets 430b and 430c on the fan device 430 from the volume of the chassis housing 404 that includes the board 406, a gasketing subsystem 446b that seals the air inlet(s) 432a and air outlets 432b and 432c on the fan device 432 from the volume of the chassis housing 404 that includes the board 406, a gasketing subsystem 446c that seals the fan device 434 such that only the air outlet 434c on the fan device 434 has access to the volume of the chassis housing 404 that includes the board 406, a gasketing subsystem 446d that seals the fan device 436 such that only the air outlet 436c on the fan device 436 has access to the volume of the chassis housing 404 that includes the board 406, and a gasketing subsystem 446e that seals the volume of the chassis housing 404 that includes battery 405 from the volume of the chassis housing 404 that includes the board 406. As such, one of skill in the art in possession of the present disclosure will appreciate how the gasketing system illustrated in FIG. 4E creates a partially sealed volume in the chassis housing 404 that includes the board 406, and that allows airflow to enter that partially sealed volume via the air outlets 434c and 436c on the fan devices 434 and 436, respectively, and exit the partially sealed volume via the surfaces on the chassis 402 (e.g., via venting and/or airflow apertures provided through the rear surface 402b, top surface (e.g., via the keyboard), bottom surface, etc.).

Figure 4F:
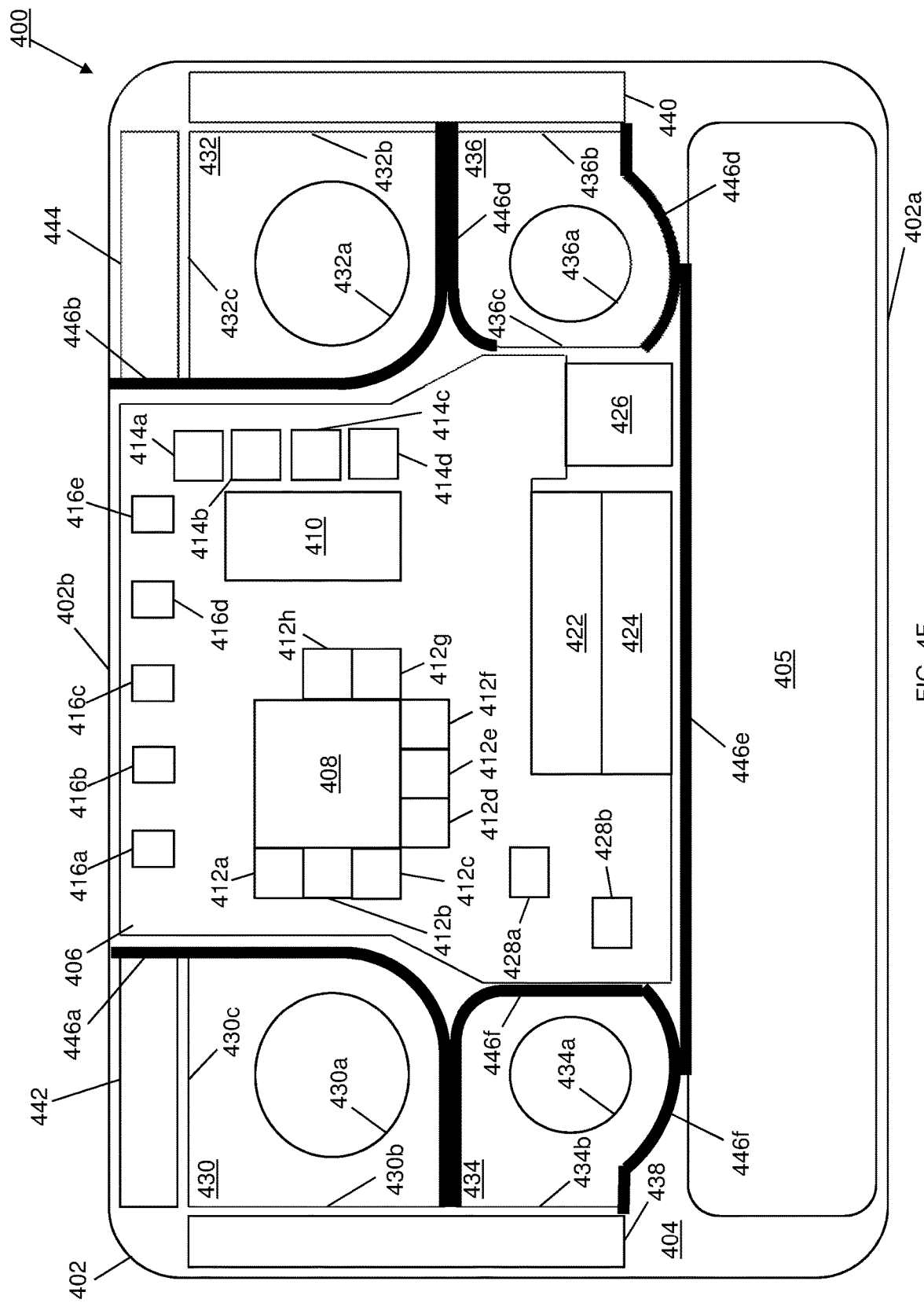
FIG. 4F is a schematic/cross-sectional view illustrating an embodiment of the computing device of FIG. 2A/2B or 3.

With reference to FIG. 4F, an embodiment of a gasketing system is illustrated that may be utilized with the quad-fan system embodiment discussed above that includes a three-fan component cooling fan system provided by the fan devices 430, 432, and 434, and a single-fan surface cooling fan system that is provided by the fan device 436. In the example illustrated in FIG. 4F, the gasketing system includes the gasketing subsystems 446a, 446b, 446d, and 446e discussed above with reference to FIG. 4E, and replaces the gasketing subsystem 446c of FIG. 4E with a gasketing subsystem 446f that seals the air inlet(s) 434a and air outlet 434b on the fan device 434 from the volume of the chassis housing 404 that includes the board 406. As such, one of skill in the art in possession of the present disclosure will appreciate how the gasketing system illustrated in FIG. 4F creates a partially sealed volume in the chassis housing 404 that includes the board 406, and that allows airflow to enter that partially sealed volume via the air outlet 436c on the fan device 436, and exit the partially sealed volume via the surfaces on the chassis 402 (e.g., via venting and/or airflow apertures provided through the rear surface 402b, top surface (e.g., via the keyboard), bottom surface, etc.). However, while two specific gasketing systems are illustrated and described above, one of skill in the art in possession of the present disclosure will appreciate how gasketing subsystems may be modified depending on the component cooling fan systems and surface cooling fan systems utilized in the computing cooling system of the present disclosure to provide the partially sealed volume described herein while remaining within the scope of the present disclosure as well.

Figure 6:
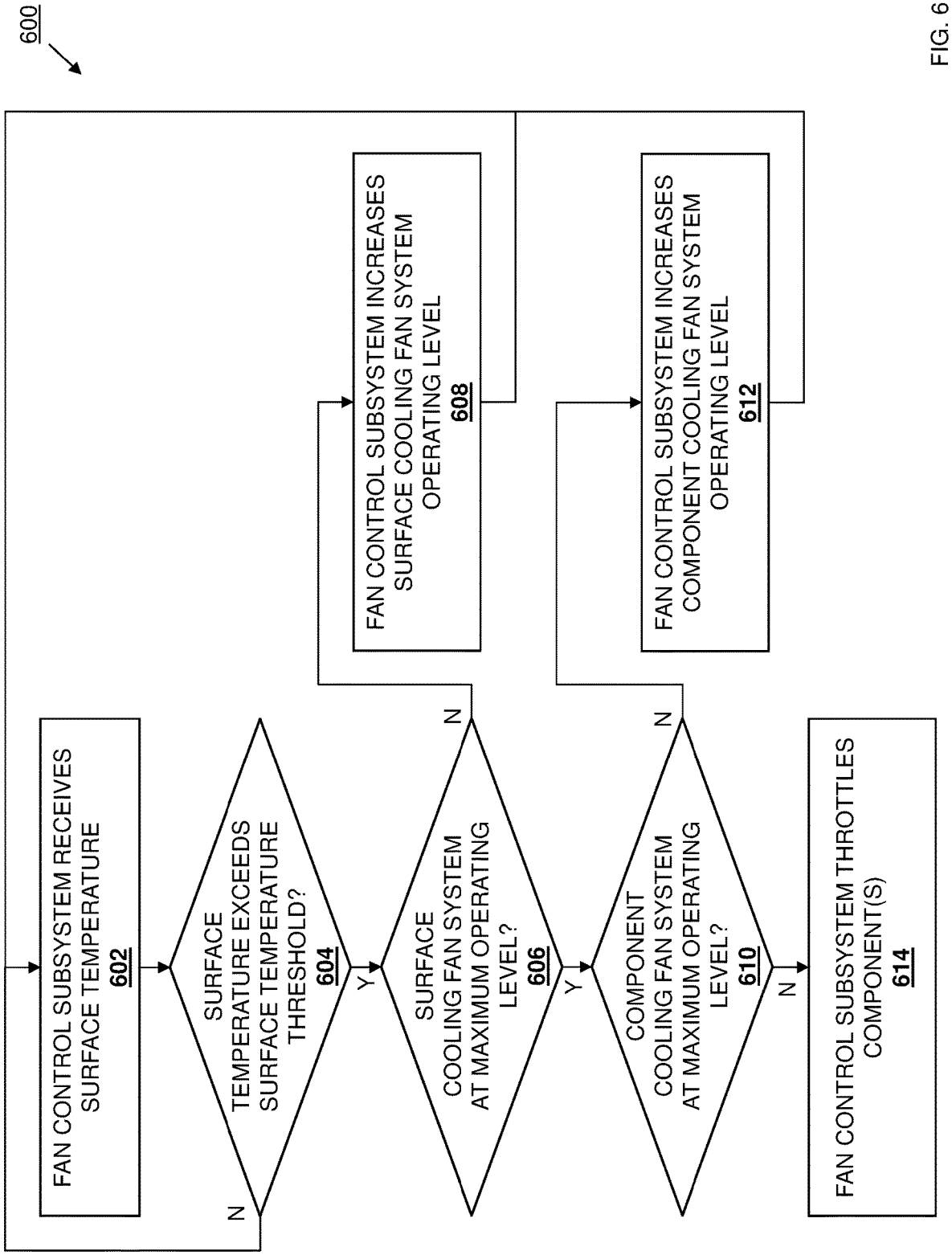
FIG. 6 is a flow chart illustrating an embodiment of a method for cooling a computing device.

Referring now to FIGS. 5 and 6, embodiments of methods 500 and 600 for cooling a computing device are illustrated. As discussed below, the systems and methods of the present disclosure combine the provisioning of a different component cooling fan system and surface cooling fan system in a chassis with relative component and fan system positioning in that chassis to allow targeted cooling of components in the chassis and surfaces of the chassis via distinct component cooling channels and surface cooling channels in order to meet the cooling requirements of relatively high-performing computing devices that produce relatively high amounts of heat. For example, the computing cooling system of the present disclosure positions relatively higher temperature components between "component cooling" fan devices that only exhaust airflow through heat dissipation devices coupled to those components and out of the chassis to provide the primary cooling for those components, while positioning relatively lower temperature components between "surface cooling" fan devices that exhaust airflow into the chassis to provide the primary cooling for the surfaces of the chassis. The computing cooling system may then identify when the higher temperature components exceed a component temperature threshold and operate the "component cooling" fan devices to cool those components, and identify when the surface of the chassis exceeds a surface temperature threshold and operate the "surface cooling" fan devices to cool that surface. The inventors of the present disclosure have found that the fan systems, component positioning, and cooling techniques described herein allow the relatively higher thermal requirements of relatively higher performance computing devices to be met while allowing the chassis provided with those computing devices to remain relatively small/thin.

Figure 7:
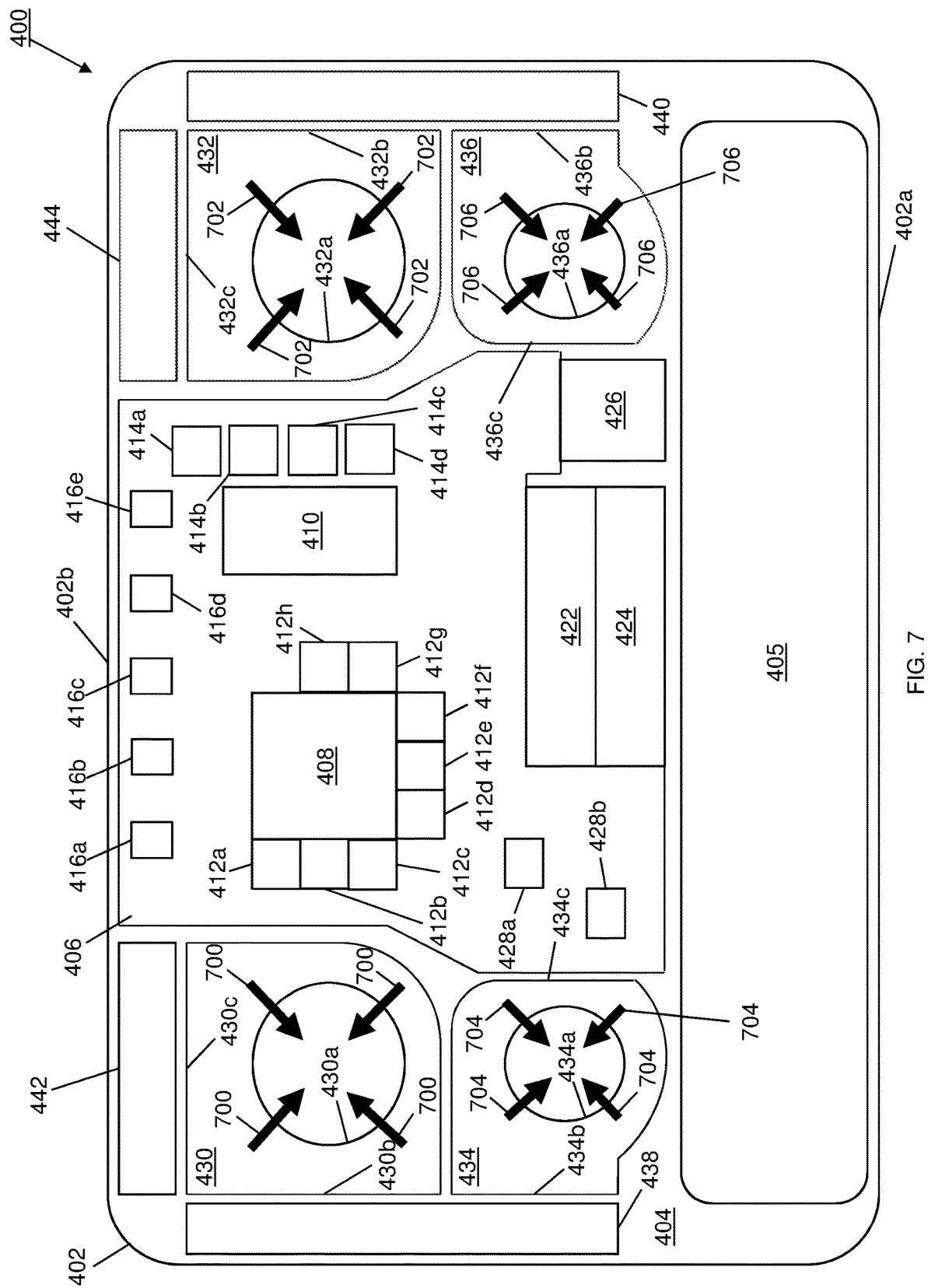
FIG. 7 is a schematic view illustrating an embodiment of the operation of the computing device of FIGS. 4A-4F during the methods of FIGS. 5 and 6.
Figure 8:
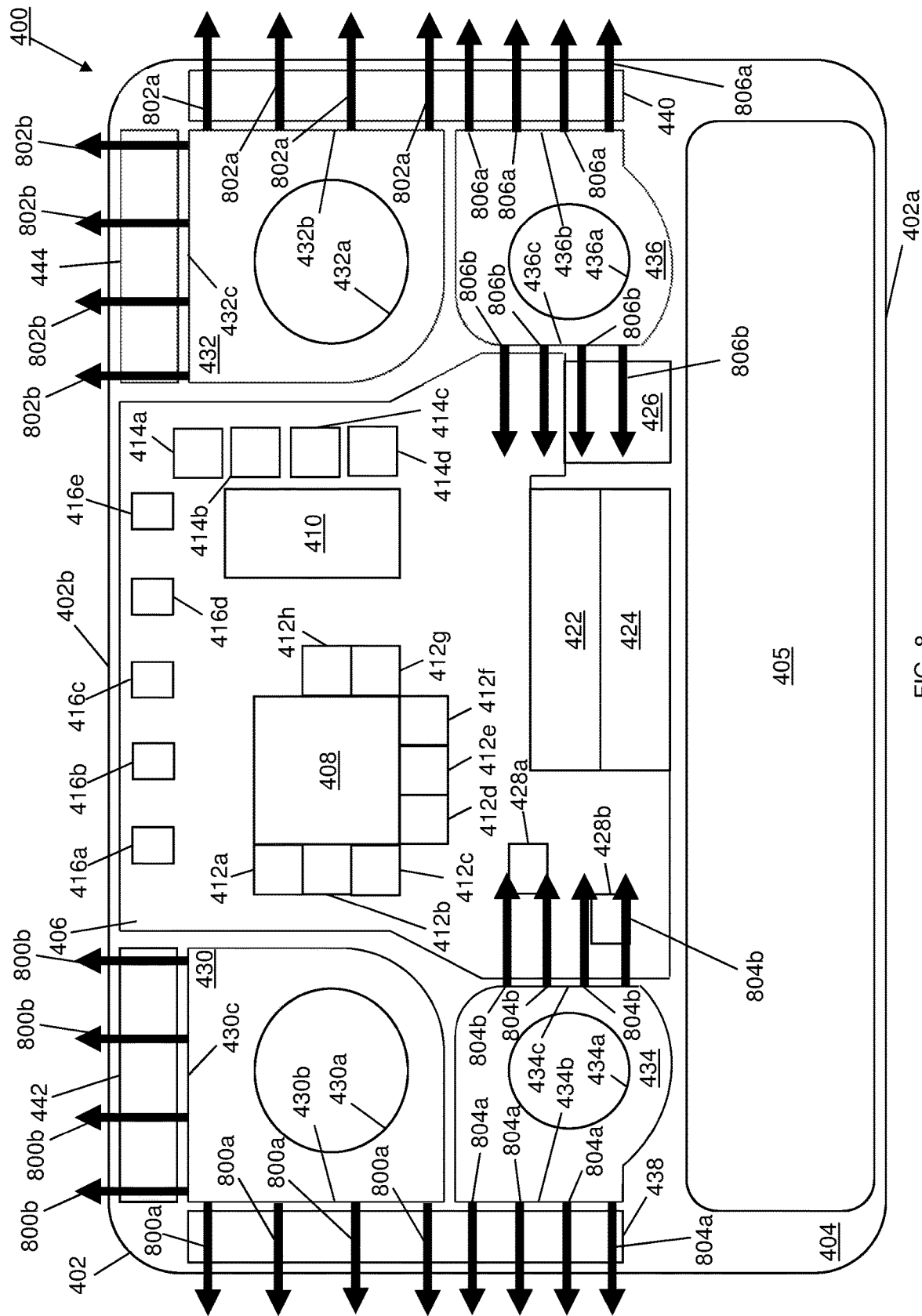
FIG. 8 is a schematic view illustrating an embodiment of the operation of the computing device of FIGS. 4A-4F during the methods of FIGS. 5 and 6.
Figure 9:
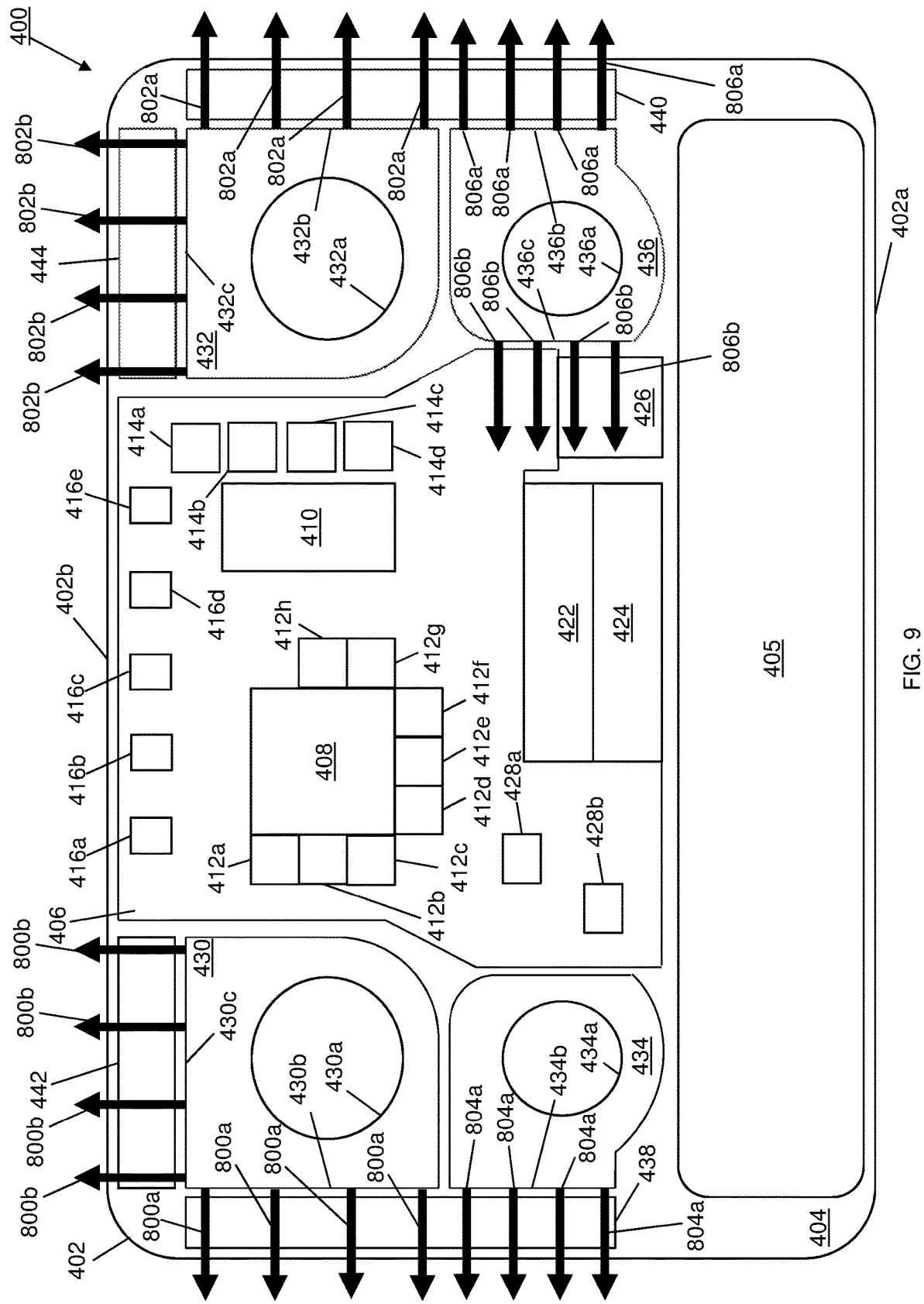
FIG. 9 is a schematic view illustrating an embodiment of the operation of the computing device of FIGS. 4A-4F during the methods of FIGS. 5 and 6.

With reference to FIGS. 7, 8, and 9, examples of the operation of the fan devices 430, 432, 434, and 436 is illustrated and described. One of skill in the art in possession of the present disclosure will appreciate how FIG. 7 illustrates inlet airflows for each of the fan devices 430, 432, 434, and 436. For example, operation of the fan device 430 will generate an inlet airflow 700 that pulls air from outside of the chassis 402, through the venting or airflow apertures defined through the top surface and/or bottom surface of the chassis 402, and into the air inlet(s) 430a on the fan device 430. Similarly, operation of the fan device 432 will generate an inlet airflow 702 that pulls air from outside of the chassis 402, through the venting or airflow apertures defined through the top surface and/or bottom surface of the chassis 402, and into the air inlet(s) 432a on the fan device 432. Similarly, operation of the fan device 434 will generate an inlet airflow 704 that pulls air from outside of the chassis 402, through the venting or airflow apertures defined through the top surface and/or bottom surface of the chassis 402, and into the air inlet(s) 434a on the fan device 434. Similarly, operation of the fan device 436 will generate an inlet airflow 706 that pulls air from outside of the chassis 402, through the venting or airflow apertures defined through the top surface and/or bottom surface of the chassis 402, and into the air inlet(s) 436a on the fan device 436. As will be appreciated by one of skill in the art in possession of the present disclosure and as discussed below, each of the fan devices 430, 432, 434, and 436 may be operated separately from each other such that each of the inlet airflows 700, 702, 704, and 706 may be different from each other at any point in time.

One of skill in the art in possession of the present disclosure will appreciate how FIG. 8 illustrates outlet airflows for each of the fan devices 430, 432, 434, and 436 when provided in the quad-fan system embodiment discussed above with reference to FIG. 4E that includes a two-fan component cooling fan system provided by the fan devices 430 and 432, and a two-fan surface cooling fan system that is provided by the fan devices 434 and 436. For example, operation of the fan device 430 will generate an outlet airflow 800a that pushes a portion of the air included in the inlet airflow 700 out of the air outlet 430b on the fan device 430, through the heat dissipation device 438, and through the venting or airflow apertures defined through the side surface 402c of the chassis 402 and out the chassis 402. Furthermore, operation of the fan device 430 will also generate an outlet airflow 800b that pushes a second portion of the air included in the inlet airflow 700 out of the air outlet 430c on the fan device 430, through the heat dissipation device 442, and through the venting or airflow apertures defined through the rear surface 402b of the chassis 402 and out the chassis 402. As will be appreciated by one of skill in the art in possession of the present disclosure, the outlet airflows 800a and 800b through the heat dissipation devices 438 and 442 operate to dissipate heat that was transferred to the heat dissipations devices 438 and 442 from the processing system 408 and memory device(s) 412a-412h via the heat transfer devices 438a and 442a, thus cooling the processing system 408 and memory device(s) 412a-412h.

Similarly, operation of the fan device 432 will generate an outlet airflow 802a that pushes a portion of the air included in the inlet airflow 702 out of the air outlet 432b on the fan device 432, through the heat dissipation device 440, and through the venting or airflow apertures defined through the side surface 402d of the chassis 402 and out the chassis 402. Furthermore, operation of the fan device 432 will also generate an outlet airflow 802b that pushes a second portion of the air included in the inlet airflow 702 out of the air outlet 432c on the fan device 432, through the heat dissipation device 444, and through the venting or airflow apertures defined through the rear surface 402b of the chassis 402 and out the chassis 402. As will be appreciated by one of skill in the art in possession of the present disclosure, the outlet airflows 802a and 802b through the heat dissipation devices 440 and 444 operate to dissipate heat that was transferred to the heat dissipations devices 440 and 444 from the processing system 410 and memory device(s) 414a-414d via the heat transfer devices 440a and 444a, thus cooling the processing system 410 and memory device(s) 414a-414d.

Similarly, operation of the fan device 434 will generate an outlet airflow 804a that pushes a portion of the air included in the inlet airflow 704 out of the air outlet 434b on the fan device 434, through the heat dissipation device 438, and through the venting or airflow apertures defined through the side surface 402c of the chassis 402 and out the chassis 402. As will be appreciated by one of skill in the art in possession of the present disclosure, the outlet airflow 804a through the heat dissipation device 438 operates to dissipate heat that was transferred to the heat dissipation device 438 from the processing system 408 and memory device(s) 412a-412h via the heat transfer device 438a, thus cooling the processing system 408 and memory device(s) 412a-412h. Furthermore, operation of the fan device 434 will also generate an outlet airflow 804b that pushes a second portion of the air included in the inlet airflow 704 out of the air outlet 434c on the fan device 434, and into the chassis housing 404 adjacent the second portion 406b of the board 406. As will be appreciated by one of skill in the art in possession of the present disclosure, the gasketing system described above with reference to FIG. 4E will require the outlet airflow 804b to exit the chassis housing 404 via the venting or airflow apertures defined through the surfaces of the chassis 402 that are immediately adjacent the board 406, and the size of that venting/those airflow apertures may cause the outlet airflow 804b to create a positive pressure volume in the chassis housing 404 that is defined by the gasketing system and located immediately adjacent the board 406, and that operates to cool surfaces of the chassis base portion 302 (while also cooling components in the chassis housing 404).

Similarly, operation of the fan device 436 will generate an outlet airflow 806a that pushes a portion of the air included in the inlet airflow 706 out of the air outlet 436b on the fan device 436, through the heat dissipation device 440, and through the venting or airflow apertures defined through the side surface 402d of the chassis 402 and out the chassis 402. As will be appreciated by one of skill in the art in possession of the present disclosure, the outlet airflow 806a through the heat dissipation device 440 operates to dissipate heat that was transferred to the heat dissipation device 440 from the processing system 410 and memory device(s) 414a-414d via the heat transfer device 440, thus cooling the processing system 410 and memory device(s) 414a-414d. Furthermore, operation of the fan device 436 will also generate an outlet airflow 806b that pushes a second portion of the air included in the inlet airflow 706 out of the air outlet 436c on the fan device 436, and into the chassis housing 404 adjacent the second portion 406b of the board 406. As will be appreciated by one of skill in the art in possession of the present disclosure, the gasketing system described above with reference to FIG. 4E will require the outlet airflow 806b to exit the chassis housing 404 via the venting or airflow apertures defined through the surfaces of the chassis 402 that are immediately adjacent the board 406, and the size of that venting/those airflow apertures may cause the outlet airflow 806*b* to create a positive pressure volume in the chassis housing 404 that is defined by the gasketing system and located immediately adjacent the board 406, and that operates to cool surfaces of the chassis base portion 302 (while also cooling components in the chassis housing 404). As will be appreciated by one of skill in the art in possession of the present disclosure and as discussed below, each of the fan devices 430, 432, 434, and 436 in FIG. 8 may be operated separately from each other such that each of the outlet airflows 800*a*/800*b*, 802*a*/802*b*, 804*a*/804*b*, and 806*a*/806*b* may be different from each other at any point in time.

One of skill in the art in possession of the present disclosure will appreciate how FIG. 9 illustrates outlet airflows for each of the fan devices 430, 432, 434, and 436 when provided in the quad-fan system embodiment discussed above with reference to FIG. 4F that includes a three-fan component cooling fan system provided by the fan devices 430, 432, and 434, and a single-fan surface cooling fan system that is provided by the fan device 436. As illustrated in FIG. 9, each of the fan devices 430, 432, and 434 may operate in substantially the same manner as described above with reference to FIG. 8, while the operation of the fan device 434 will only generate the outlet airflow 804*a* that pushes the air included in the inlet airflow 704 out of the air outlet 434*b* on the fan device 434, through the heat dissipation device 438, and through the venting or airflow apertures defined through the side surface 402*c* of the chassis 402 and out the chassis 402. As such, the fan device 434 in FIG. 9 produces the outlet airflow 804*a* through the heat dissipation device 438 that operates to dissipate heat that was transferred to the heat dissipation device 438 from the processing system 408 and memory device(s) 412*a*-412*h* via the heat transfer device 438*a*, thus cooling the processing system 408 and memory device(s) 412*a*-412*h*, but does not produce any outlet airflow into the chassis housing 404 (i.e., due to the fan device 434 not including the airflow outlet 434*c* in the embodiment illustrated in FIG. 9). Similarly as discussed above, each of the fan devices 430, 432, 434, and 436 in FIG. 9 may be operated separately from each other such that each of the outlet airflows 800*a*/800*b*, 802*a*/802*b*, 804*a*, and 806*a*/806*b* may be different from each other at any point in time.

In the discussion below, the method 500 that is primarily concerned with cooling components in a computing device is described as being performed prior to the method 600 that is primarily concerned with cooling the surface of the chassis of that computing device. However, one of skill in the art in possession of the present disclosure will appreciate how the methods 500 and 600 may be performed in a different order or at the same time in order to perform the component cooling and/or chassis surface cooling as needed. Furthermore, prior to the methods 500 and 600, fan devices used to cool components (e.g., the fan devices 430 and 432 in the embodiments discussed above with reference to FIGS. 4E and 8; the fan devices 430, 432, and 434 in the embodiments discussed above with reference to FIGS. 4F and 9) may be mapped to the component temperature sensor(s) 214 (e.g., in the fan control database 210), while fan devices used to cool the chassis surface (e.g., the fan devices 434 and 436 in the embodiments discussed above with reference to FIGS. 4E and 8; the fan device 436 in the embodiments discussed above with reference to FIGS. 4F and 9) may be mapped to the surface temperature sensor(s) 216 (e.g., in the fan control database 210). Further still, in some examples, any of the fan devices 430, 432, 434, and/or 436 may be associated with acoustical information for those fan devices (which may be provided in a look-up table in the fan control database 210), which may allow the fan control engine 204 to consider the acoustical cost associated with the operation of any combination of the fan devices 430, 432, 434, and/or 436 during the methods 500 and 600.

For example, a software interface with the fan control engine 204 in the computing device 200 may allow a user of the computing device 200 to define performance/cooling/acoustical profile for the computing device 200 that may be stored in the fan control database 210. As will be appreciated by one of skill in the art in possession of the present disclosure, the performance (e.g., processing/memory performance) of the computing device 200 will be proportional to both the cooling required for the computing device 200 (e.g., higher performance translates to higher cooling requirements) and the acoustics produced by the computing device 200 (e.g., high cooling operations translates to higher acoustics/more noise from the fan systems in the computing device 200). As such, the software interface discussed above may allow the user of the computing device to prioritize performance of the computing device 200 (i.e., at the expense of higher cooling/more noise from the fan systems), prioritize lower acoustics/less noise from the computing device 200 (i.e., at the expense of performance by the computing device 200), and/or combinations thereof.

For example, User Experience (UX) research has indicated that surface temperature of the chassis 202 on the computing device 200 tends to be prioritized higher than performance, and thus default performance/cooling/acoustical profiles for the computing device 200 may prioritize lower surface temperatures of the chassis 202 on the computing device 200 the highest, followed by lower component temperatures, followed by component threshold temperatures (which one of skill in the art in possession of the present disclosure will recognize should be prevented for any extended amount of time to prevent component degradation). However, one of skill in the art in possession of the present disclosure will appreciate how a performance/cooling/acoustical profile for the computing device 200 may be defined in any manner desired by a user (e.g., a user that typically utilizes a laptop/notebook computing device that is positioned on a desk and with noise-cancelling headphones may deprioritize surface temperature of the chassis 202 on the computing device 200, and may prioritize component performance/component cooling due to their typical lack of physical engagement with the bottom surface of the chassis 202 on the computing device 200, and their typical insensitivity to higher acoustics/more noise from the fan systems in the computing device 200).

The method 500 begins at block 502 where a fan control subsystem receives a component temperature. In an embodiment, at block 502, the fan control engine 204 in the computing device 200 may receive a component temperature from the component temperature sensor(s) 214. As will be appreciated by one of skill in the art in possession of the present disclosure, the component temperature sensor(s) 214 may report component temperatures for any of the components in the computing device 200, and thus at block 502 the fan control engine 204 may receive component temperatures of the processing system 408, the processing system 410, the memory devices 412*a*-412*h*, the memory devices 414*a*-414*d*, and/or any other components that would be apparent to one of skill in the art in possession of the present disclosure.

The method 500 then proceeds to decision block 504 where it is determined whether the component temperature exceeds a component temperature threshold. In an embodiment, at decision block 504, the fan control engine 204 in the computing device 200 may compare the component temperature received at block 502 to component temperature thresholds for the component(s) associated with that component temperature in order to determine whether that component temperature of the component(s) exceeds the any component temperature threshold(s) for the component(s). To provide a specific example, at block 502 a processing system temperature associated with the processing system 408 (e.g., a temperature of that processing system 408, a temperature adjacent that processing system 408, a temperature of a component associated with the processing system 408, etc.) may be received at block 502 and, in response, at decision block 504 the fan control engine 204 may determine whether that processing system temperature exceeds processing system temperature threshold(s) associated with the processing system 408. As discussed further below, different component temperature thresholds may be associated with different fan operating levels, and thus a first processing system temperature threshold for the processing system 408 may be associated with a first fan operating level for the fan device(s) that are configured to cool the processing system 408, a second processing system temperature threshold for the processing system 408 may be associated with a second fan operating level for the fan device(s) that are configured to cool the processing system 408, and so on.

If, at decision block 504, it is determined that the component temperature exceeds the component temperature threshold, the method 500 proceeds to decision block 506 where it is determined whether a component cooling fan system is operating at a maximum operating level. In an embodiment, at decision block 506 and in response to determining that the component temperature received at block 502 exceeds a component temperature threshold for a component, the fan control engine 204 in the computing device 200 may determine whether a component cooling fan system that is configured to cool that component is operating at a maximum operating level. Continuing with the example above in which the processing system temperature of the processing system 408 has exceeded a processing system temperature threshold, at decision block 506 the fan control engine 204 may determine whether the component cooling fan system that is configured to cool the processing system 408 is operating at a maximum operating level. As such, in embodiments in which the component cooling fan system includes the fan devices 430 and 432 that may be operated independently to provide the component cooling airflows discussed above, the fan control engine 204 may determine whether the fan device 430 (which as discussed above provides cooling for the processing system 408) is operating at a maximum operating level.

However, in some embodiments, the component cooling fan system may include the fan devices 430 and 432 that are operated together to provide the component cooling airflows discussed above, and at decision block 506 the fan control engine 204 may determine whether the fan devices 430 and 432 are operating at a maximum operating level. Similarly, in some embodiments, the component cooling fan system may include the fan devices 430, 432, and 434 that are operated together to provide the component cooling airflows discussed above, and at decision block 506 the fan control engine 204 may determine whether the fan devices 430, 432, and 434 are operating at a maximum operating level. In some embodiments, the maximum operating level utilized at block 506 may coincide with the maximum operating speed of the fan device at issue. However, as discussed above, performance/cooling/acoustical profiles may be defined for the computing device 200/400, and thus in other embodiments, the maximum operating level utilized at block 506 may coincide with the operating speed of the fan device at issue in consideration of a performance/cooling/acoustical profile. For example, when a first performance/cooling/acoustical profile prioritizes relatively lower acoustics/less noise, the maximum operating level utilized at block 506 may coincide with an operating speed of the fan device at issue that is relatively lower than the operating speed of that fan device that is provided according to a second performance/cooling/acoustical profile that prioritizes performance (and thus higher acoustics/more noise).

If at decision block 506, it is determined that the component cooling fan system is not operating at a maximum operating level, the method 500 proceeds to block 508 where the fan control subsystem increases the component cooling fan system operating level. In an embodiment, at block 508 and in response to determining that the component cooling fan system is not operating at a maximum operating level, the fan control engine 204 may cause the component cooling fan system to increase its component cooling fan system operating level. In a specific example, the increasing of the component cooling fan system operating level may be based on the current temperature of the component being cooled, and may be defined by a component cooling fan system operating level increase lookup table such as the component cooling fan system operating level increase lookup table provided below:

| COMPONENT TEMPERATURE THRESHOLD (° C.) | FAN SYSTEM OPERATING LEVEL INCREASE (PWM) |
| --- | --- |
| 80 | 1 |
| 90 | 5 |
| 95 | 10 |

As will be appreciated by one of skill in the art in possession of the present disclosure, the component cooling fan system operating level increase lookup table in the example above provides for an increase in the component cooling fan system operating level by 1 PWM for any component temperatures between 80-90 degrees Celsius, an increase in the component cooling fan system operating level by 5 PWM for any component temperatures between 90-95 degrees Celsius, an increase in the component cooling fan system operating level by 10 PWM for any component temperatures above 95 degrees Celsius.

Following block 508, the method 500 returns to block 502. As such, for any component that has a component temperature that exceeds a threshold, the method 500 may loop such that the fan control engine 204 receives the component temperature for that component, determines that component temperature exceeds a component temperature threshold, and as long as the component cooling fan system associated with that component is not operating at a maximum operating level, the fan control engine 204 may increase its component cooling fan system operating level. Thus, with reference to the component cooling fan system operating level increase lookup table provided in the example above, if the component cooling fan system associated with a component is initially not operating and a component temperature for that component is received that falls between 80-90 degrees Celsius on a first loop of the method 500, that component cooling fan system may then be operated at a component cooling fan system operating level of 1 PWM. Subsequently, on a second loop of the method 500, if the component cooling fan system associated with a component is operating at the component cooling fan system operating level of 1 PWM and a component temperature for that component is received that falls between 90-95 degrees Celsius, the component cooling fan system operating level of that component cooling fan system may then be increased to 6 PWM. Subsequently as well, on a third loop of the method 500, if the component cooling fan system associated with a component is operating at the component cooling fan system operating level of 6 PWM and a component temperature for that component is received that falls above 95 degrees Celsius, the component cooling fan system operating level of that component cooling fan system may then be increased to 16 PWM.

As such, the method 500 will operate to increase the component cooling fan system operating level of the component cooling fan system associated with a component as long as the component temperature of that component is above a component temperature threshold for that component, and as long as that component cooling fan system is not operating at a maximum operating level. Thus, continuing with the specific example above in which the fan device 430 is operated independently to cool the processing system 408, the fan device operating level of the fan device 430 may be increased as the method 500 loops as long as the processing system temperature of the processing system 408 exceeds a processing system temperature threshold and the fan device 430 is not operating at a maximum operating level.

If at decision block 506, it is determined that the component cooling fan system is operating at a maximum operating level, the method 500 proceeds to decision block 510 where it is determined whether a surface cooling fan system is operating at a maximum operating level. In an embodiment, at decision block 510 and in response to determining that the component cooling fan system is operating at a maximum operating level, the fan control engine 204 in the computing device 200 may determine whether a surface cooling fan system that is configured to cool surface(s) of the chassis is operating at a maximum operating level. Continuing with the example above in which the processing system temperature of the processing system 408 has exceeded a processing system temperature threshold, at decision block 506 the fan control engine 204 may determine whether the surface cooling fan system that is configured to cool surface(s) of the chassis 402 is operating at a maximum operating level. As such, in embodiments in which the surface cooling fan system includes the fan devices 434 and 436 that may be operated independently to provide surface cooling airflows (along with component cooling airflows), the fan control engine 204 may determine whether the fan device 434 (which as discussed above provides cooling for the processing system 408 along with the surface(s) of the chassis 402) is operating at a maximum operating level.

However, in some embodiments, the surface cooling fan system may include the fan devices 434 and 436 that are operated together to provide surface cooling airflows (along with component cooling airflows), and at decision block 510 the fan control engine 204 may determine whether the fan devices 434 and 436 are operating at a maximum operating level. Similarly, in some embodiments, the surface cooling fan system may include only the fan device 436 that provides surface cooling airflows (along with component cooling airflows), and at decision block 510 the fan control engine 204 may determine whether the fan device 436 is operating at a maximum operating level. Similarly as described above, the maximum operating level utilized at block 510 may coincide with the maximum operating speed of the fan device at issue. However, as also discussed above, performance/cooling/acoustical profiles may be defined for the computing device 200/400, and thus in other embodiments, the maximum operating level utilized at block 510 may coincide with the operating speed of the fan device at issue in consideration of a performance/cooling/acoustical profile. For example, when a first performance/cooling/acoustical profile prioritizes relatively lower acoustics/less noise, the maximum operating level utilized at block 510 may coincide with an operating speed of the fan device at issue that is relatively lower than the operating speed of that fan device that is provided according to a second performance/cooling/acoustical profile that prioritizes performance (and thus higher acoustics/more noise).

If at decision block 510, it is determined that the surface cooling fan system is not operating at a maximum operating level, the method 500 proceeds to block 512 where the fan control subsystem increases the surface cooling fan system operating level. In an embodiment, at block 512 and in response to determining that the surface cooling fan system is not operating at a maximum operating level, the fan control engine 204 may cause the surface cooling fan system to increase its surface cooling fan system operating level. In a specific example, the increasing of the surface cooling fan system operating level according to the method 500 (e.g., when a component is exceeding a component temperature threshold and the component cooling fan system is operating at a maximum operating level) may be incremental. For example, any time a component is exceeding a component temperature threshold and the component cooling fan system is operating at a maximum operating level, the fan control engine 204 may cause the surface cooling fan system operating level of the surface cooling fan system to increase by 5% PWM.

Following block 512, the method 500 returns to block 502. As such, for any component that has a component temperature that exceeds a threshold while the component cooling fan system is operating at a maximum component cooling fan system operating level, the method 500 may loop such that the fan control engine 204 receives the component temperature for that component, determines that component temperature exceeds a component temperature threshold, and as long as the component cooling fan system associated with that component is operating at a maximum operating level and the surface cooling fan system is not operating at a maximum operating level, the fan control engine 204 may increase the surface cooling fan system operating level of the surface cooling fan system. As such, if the surface cooling fan system is initially not operating and a component temperature for a component exceeds its component temperature threshold while the component cooling fan system is operating at a maximum operating level, that surface cooling fan system may then be operated at a default/first operating level. Subsequently, on a second loop of the method 500, if the component temperature for the component continues to exceed its component temperature threshold while the component cooling fan system continues to operate at a maximum operating level, the surface cooling fan system operating level of the surface cooling fan system may then be increased by 5%. Subsequently as well, on a third loop of the method 500, if the component temperature for the component continues to exceed its component temperature threshold while the component cooling fan system continues to operate at a maximum operating level, the surface cooling fan system operating level of the surface cooling fan system may then be increased by 5% again.

As such, the method 500 will operate to increase the surface cooling fan system operating level of the surface cooling fan system as long as a component temperature of a component is above a component temperature threshold for that component while the component cooling fan system is operating at a maximum operating level, and as long as that surface cooling fan system is not operating at a maximum operating level. Thus, continuing with the specific example above in which the processing system temperature of the processing system 408 exceeds a processing system temperature threshold and the fan device 430 is operating at a maximum operating level, the operating level of the fan devices 434 and/or 436 may be increased until either the processing system temperature of the processing system 408 falls below its processing system temperature threshold, or the fan devices 434 and/or 436 are operating at a maximum operating level.

If at decision block 510, it is determined that the surface cooling fan system is operating at a maximum operating level, the method 500 proceeds to block 514 where the fan control subsystem throttles one or more components. In an embodiment, at block 514 in response to a component continuing to exceed its component temperature threshold while the component cooling fan system and the surface cooling fan system are operated at their maximum operating levels, the fan control engine 204 in the computing device 200 may operate to throttle that component (and/or other components, if necessary). Thus, continuing with the specific example above in which the processing system temperature of the processing system 408 exceeds a processing system temperature threshold, the fan device 430 is operating at a maximum operating level, and the fan devices 434 and/or 436 are operating at a maximum operating level, the fan control engine 204 may operate to throttle the operation of the processing system 408, its memory device(s) 412$a$-412$h$, and/or any other components that one of skill in the art in possession of the present disclosure would recognize as reducing the processing temperature of the processing system 408 below its processing system temperature threshold.

Referring now to FIG. 6, the method 600 begins at block 602 where a fan control subsystem receives a component temperature. In an embodiment, at block 602, the fan control engine 204 in the computing device 200 may receive a surface temperature from the surface temperature sensor(s) 216. As will be appreciated by one of skill in the art in possession of the present disclosure, the surface temperature sensor(s) 216 may report surface temperatures for any surface on the chassis 202 of the computing device 200. For example, with reference to the computing device 300 discussed above with reference to FIG. 3, at block 602 the fan control engine 204 may receive surface temperatures of any portion of the top surface 302$a$ of the chassis base portion 302, any portion of the bottom surface 302$b$ of the chassis base portion 302, any portion of the front surface 302$c$ of the chassis base portion 302, any portion of the rear surface 302$d$ of the chassis base portion 302, any portion of the side surfaces 302$e$ and 302$f$ of the chassis base portion 302, any portion of the chassis display portion 304, and/or any other surface that would be apparent to one of skill in the art in possession of the present disclosure.

The method 600 then proceeds to decision block 604 where it is determined whether the surface temperature exceeds a surface temperature threshold. In an embodiment, at decision block 604, the fan control engine 204 in the computing device 200 may compare the surface temperature received at block 602 to surface temperature thresholds for the surface(s) associated with that surface temperature in order to determine whether that surface temperature of the surface(s) exceeds the any surface temperature threshold(s) for the surface(s). To provide a specific example, at block 602$a$ surface temperature associated with the bottom surface 302$b$ of the chassis base surface 302 (e.g., an average temperature of that bottom surface 302$b$, a highest temperature of a portion of that bottom surface 302$b$, a temperature of a component engaging that bottom surface 302$b$, etc.) may be received at block 602 and, in response, at decision block 604 the fan control engine 204 may determine whether that surface temperature exceeds surface temperature threshold(s) associated with the bottom surface 302$b$ of the chassis base portion 302. As discussed further below, different surface temperature thresholds may be associated with different fan operating levels, and thus a first surface temperature threshold for the bottom surface 302$b$ of the chassis base portion 302 may be associated with a first fan operating level for the fan device(s) that are configured to cool the bottom surface 302$b$ of the chassis base portion 302, a second surface temperature threshold for the bottom surface 302$b$ of the chassis base portion 302 may be associated with a second fan operating level for the fan device(s) that are configured to cool the bottom surface 302$b$ of the chassis base portion 302, and so on.

If, at decision block 604, it is determined that the surface temperature exceeds the surface temperature threshold, the method 600 proceeds to decision block 606 where it is determined whether a surface cooling fan system is operating at a maximum operating level. In an embodiment, at decision block 606 and in response to determining that the surface temperature received at block 602 exceeds a surface temperature threshold for a surface, the fan control engine 204 in the computing device 200 may determine whether a surface cooling fan system that is configured to cool that surface is operating at a maximum operating level. Continuing with the example above in which the surface temperature of the bottom surface 302$b$ of the chassis base portion 302 has exceeded a surface temperature threshold, at decision block 606 the fan control engine 204 may determine whether the surface cooling fan system that is configured to cool the bottom surface 302$b$ of the chassis base portion 302 is operating at a maximum operating level. As such, in embodiments in which the surface cooling fan system includes the fan devices 434 and 436 that may be operated independently to provide the surface cooling airflows discussed above, the fan control engine 204 may determine whether the fan device 434 and/or 436 (which as discussed above provide cooling for the surfaces on the chassis 402) are operating at a maximum operating level.

However, in some embodiments, the surface cooling fan system may include the fan devices 434 and 436 that are operated together to provide the surface cooling airflows discussed above, and at decision block 606 the fan control engine 204 may determine whether the fan devices 434 and 436 are operating at a maximum operating level. Similarly, in some embodiments, the component cooling fan system may include only the fan device 436 that is operated to provide the surface cooling airflows discussed above, and at decision block 606 the fan control engine 204 may determine whether the fan device 436 is operating at a maximum operating level. In some embodiments, the maximum operating level utilized at block 606 may coincide with the maximum operating speed of the fan device at issue. However, as discussed above, performance/cooling/acoustical profiles may be defined for the computing device 200/400, and thus in other embodiments, the maximum operating level utilized at block 606 may coincide with the operating speed of the fan device at issue in consideration of a performance/cooling/acoustical profile. For example, when a first performance/cooling/acoustical profile prioritizes relatively lower acoustics/less noise, the maximum operating level utilized at block 606 may coincide with an operating speed of the fan device at issue that is relatively lower than the operating speed of that fan device that is provided according to a second performance/cooling/acoustical profile that prioritizes performance (and thus higher acoustics/more noise).

If at decision block 606, it is determined that the surface cooling fan system is not operating at a maximum operating level, the method 600 proceeds to block 608 where the fan control subsystem increases the surface cooling fan system operating level. In an embodiment, at block 608 and in response to determining that the surface cooling fan system is not operating at a maximum operating level, the fan control engine 204 may cause the surface cooling fan system to increase its surface cooling fan system operating level. In a specific example, the increasing of the surface cooling fan system operating level may be based on the current temperature of the surface being cooled, and may be defined by a surface cooling fan system operating level increase lookup table such as the surface cooling fan system operating level increase lookup table provided below:

| COMPONENT TEMPERATURE THRESHOLD (° C.) | FAN SYSTEM OPERATING LEVEL INCREASE (PWM) |
|---|---|
| 50 | 2 |
| 60 | 4 |
| 65 | 10 |

As will be appreciated by one of skill in the art in possession of the present disclosure, the surface cooling fan system operating level increase lookup table in the example above provides for an increase in the surface cooling fan system operating level by 2 PWM for any surface temperatures between 50-60 degrees Celsius, an increase in the surface cooling fan system operating level by 4 PWM for any surface temperatures between 60-65 degrees Celsius, an increase in the surface cooling fan system operating level by 10 PWM for any surface temperatures above 65 degrees Celsius.

Following block 608, the method 600 returns to block 602. As such, for any surface that has a surface temperature that exceeds a threshold, the method 600 may loop such that the fan control engine 204 receives the surface temperature for that surface, determines that surface temperature exceeds a surface temperature threshold, and as long as the surface cooling fan system associated with that surface is not operating at a maximum operating level, the fan control engine 204 may increase its surface cooling fan system operating level. As such, with reference to the surface cooling fan system operating level increase lookup table provided in the example above, if the surface cooling fan system associated with a surface is initially not operating and a surface temperature for that surface is received that falls between 50-60 degrees Celsius on a first loop of the method 600, that surface cooling fan system may then be operated at a surface cooling fan system operating level of 2 PWM. Subsequently, on a second loop of the method 600, if the surface cooling fan system associated with a surface is operating at the surface cooling fan system operating level of 2 PWM and a surface temperature for that surface is received that falls between 60-65 degrees Celsius, the surface cooling fan system operating level of that surface cooling fan system may then be increased to 6 PWM. Subsequently as well, on a third loop of the method 600, if the surface cooling fan system associated with a surface is operating at the surface cooling fan system operating level of 6 PWM and a surface temperature for that surface is received that falls above 65 degrees Celsius, the surface cooling fan system operating level of that surface cooling fan system may then be increased to 16 PWM.

As such, the method 600 will operate to increase the surface cooling fan system operating level of the surface cooling fan system associated with a surface as long as the surface temperature of that surface is above a surface temperature threshold for that surface, and as long as that surface cooling fan system is not operating at a maximum operating level. Thus, continuing with the specific example above in which the fan devices 434 and/or 436 are operated independently to cool the bottom surface 302b of the chassis base portion 302, the fan device operating level of the fan devices 434 and/or 436 may be increased as the method 600 loops as long as the surface temperature of the bottom surface 302b of the chassis base portion 302 exceeds a surface temperature threshold and the fan devices 434 and/or 436 are not operating at a maximum operating level.

If at decision block 606, it is determined that the surface cooling fan system is operating at a maximum operating level, the method 600 proceeds to decision block 610 where it is determined whether a component cooling fan system is operating at a maximum operating level. In an embodiment, at decision block 610 and in response to determining that the surface cooling fan system is operating at a maximum operating level, the fan control engine 204 in the computing device 200 may determine whether a component cooling fan system that is configured to cool components in the chassis is operating at a maximum operating level. Continuing with the example above in which the surface temperature of the bottom surface 302b of the chassis base portion 302 has exceeded a surface temperature threshold, at decision block 606 the fan control engine 204 may determine whether the component cooling fan system that is configured to cool components in the chassis 402 is operating at a maximum operating level. As such, in embodiments in which the component cooling fan system includes the fan devices 430 and 432 that may be operated independently to provide component cooling airflows, the fan control engine 204 may determine whether the fan devices 430 and/or 432 are operating at a maximum operating level.

However, in some embodiments, the component cooling fan system may include the fan devices 430 and 432 that are operated together to provide component cooling airflows, and at decision block 610 the fan control engine 204 may determine whether the fan devices 430 and 432 are operating at a maximum operating level. Similarly, in some embodiments, the component cooling fan system may include the fan devices 430, 432, and 434 that provide component cooling airflows, and at decision block 510 the fan control engine 204 may determine whether the fan devices 430, 432, and/or 436 are operating at a maximum operating level. Similarly as described above, the maximum operating level utilized at block 610 may coincide with the maximum operating speed of the fan device at issue. However, as also discussed above, performance/cooling/acoustical profiles may be defined for the computing device 200/400, and thus in other embodiments, the maximum operating level utilized at block 610 may coincide with the operating speed of the fan device at issue in consideration of a performance/cooling/acoustical profile. For example, when a first performance/cooling/acoustical profile prioritizes relatively lower acoustics/less noise, the maximum operating level utilized at block 610 may coincide with an operating speed of the fan device at issue that is relatively lower than the operating speed of that fan device that is provided according to a second performance/cooling/acoustical profile that prioritizes performance (and thus higher acoustics/more noise).

If at decision block 610, it is determined that the component cooling fan system is not operating at a maximum operating level, the method 600 proceeds to block 612 where the fan control subsystem increases the component cooling fan system operating level. In an embodiment, at block 612 and in response to determining that the component cooling fan system is not operating at a maximum operating level, the fan control engine 204 may cause the component cooling fan system to increase its component cooling fan system operating level. In a specific example, the increasing of the component cooling fan system operating level according to the method 600 (e.g., when a surface is exceeding a surface temperature threshold and the surface cooling fan system is operating at a maximum operating level) may be incremental. For example, any time a surface is exceeding a surface temperature threshold and the surface cooling fan system is operating at a maximum operating level, the fan control engine 204 may cause the component cooling fan system operating level of the component cooling fan system to increase by 5% PWM.

Following block 612, the method 600 returns to block 602. As such, for any surface that has a surface temperature that exceeds a threshold while the surface cooling fan system is operating at a maximum surface cooling fan system operating level, the method 600 may loop such that the fan control engine 204 receives the surface temperature for that surface, determines that surface temperature exceeds a surface temperature threshold, and as long as the surface cooling fan system associated with that surface is operating at a maximum operating level and the component cooling fan system is not operating at a maximum operating level, the fan control engine 204 may increase the component cooling fan system operating level of the component cooling fan system. As such, if the component cooling fan system is initially not operating and a surface temperature for a surface exceeds its surface temperature threshold while the surface cooling fan system is operating at a maximum operating level, that component cooling fan system may then be operated at a default/first operating level. Subsequently, on a second loop of the method 500, if the surface temperature for the surface continues to exceed its surface temperature threshold while the surface cooling fan system continues to operate at a maximum operating level, the component cooling fan system operating level of the component cooling fan system may then be increased by 5%. Subsequently as well, on a third loop of the method 500, if the surface temperature for the surface continues to exceed its surface temperature threshold while the surface cooling fan system continues to operate at a maximum operating level, the component cooling fan system operating level of the component cooling fan system may then be increased by 5% again.

As such, the method 500 will operate to increase the component cooling fan system operating level of the component cooling fan system as long as a surface temperature of a surface is above a surface temperature threshold for that surface while the surface cooling fan system is operating at a maximum operating level, and as long as that component cooling fan system is not operating at a maximum operating level. Thus, continuing with the specific example above in which the surface temperature of the bottom surface 302b of the chassis base portion 302 exceeds a surface temperature threshold and the fan devices 434 and/or 436 are operating at a maximum operating level, the operating level of the fan devices 430 and/or 432 may be increased until either the surface temperature of the bottom surface 302b of the chassis base portion 302 falls below its surface temperature threshold, or the fan devices 430 and/or 434 are operating at a maximum operating level.

If at decision block 610, it is determined that the component cooling fan system is operating at a maximum operating level, the method 600 proceeds to block 614 where the fan control subsystem throttles one or more components. In an embodiment, at block 514 in response to a surface continuing to exceed its surface temperature threshold while the surface cooling fan system and the component cooling fan system are operated at their maximum operating levels, the fan control engine 204 in the computing device 200 may operate to throttle one or more components in the computing device 200. Thus, continuing with the specific example above in which the surface temperature of the bottom surface 302b of the chassis base portion 302 exceeds a surface temperature threshold, the fan devices 434 and/or 436 are operating at a maximum operating level, and the fan devices 430 and/or 432 are operating at a maximum operating level, the fan control engine 204 may operate to throttle the operation of the processing system 408, its memory device(s) 412a-412h, the processing system 410, its memory devices 414a-414d, and/or any other components that one of skill in the art in possession of the present disclosure would recognize as reducing the surface temperature of the bottom surface 302b of the chassis base portion 302 below its surface temperature threshold.

Thus, systems and methods have been described that combine the provisioning of a different component cooling fan system and surface cooling fan system in a laptop/notebook computing device with relative component and fan system positioning in that laptop/notebook computing device to allow targeted cooling of components in the laptop/notebook computing device and surfaces of the laptop/notebook computing device in order to meet the cooling requirements of relatively high performing laptop/notebook computing devices that produce relatively high amounts of heat. For example, the computing cooling system of the present disclosure positions relatively higher temperature components between "component cooling" fan devices that only exhaust airflow through heat dissipation devices coupled to those components and out of the laptop/notebook computing device to provide the primary cooling those components, while positioning relatively lower temperature components between "surface cooling" fan devices that exhaust airflow into the laptop/notebook computing device to provide the primary cooling of the surface of the laptop/notebook computing device. The computing cooling system may then identify when the higher temperature components exceed a component temperature threshold and operate the "component cooling" fan devices to cool those components, or identify when surface(s) of the laptop/notebook computing device exceeds a surface temperature threshold and operate the "surface cooling" fan devices to cool those surface(s). The inventors of the present disclosure have found that the fan systems, component positioning, and cooling techniques described herein allow the relatively higher thermal requirements of relatively higher performance laptop/notebook computing devices to be met while allowing the laptop/notebook computing device to remain relatively small/thin.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A computing cooling system, comprising:
a chassis defining a chassis housing;
at least one heat producing component that is located in the chassis housing;
at least one first heat dissipation device that is thermally coupled to the at least one heat producing component and located in the chassis housing adjacent at least one first chassis air outlet defined by the chassis, and at least one second heat dissipation device that is thermally coupled to the at least one heat producing component and located in the chassis housing opposite the at least one heat producing component from the at least one first heat dissipation device and adjacent at least one second chassis air outlet defined by the chassis;
a first fan device that is located in the chassis housing adjacent the at least one first heat dissipation device, at least one first chassis air inlet defined by the chassis, a first chassis wall on the chassis that defines a first chassis air outlet that is included in the at least one first chassis air outlet, and a second chassis wall on the chassis that defines a second chassis air outlet that is included in the at least one first chassis air outlet and that is oriented substantially perpendicularly to the first chassis wall, wherein the first fan device is configured to:
pull first air from outside of the chassis into the first fan device via the at least one first chassis air inlet;
push a first portion of the first air past the at least one first heat dissipation device and out of the chassis via the first chassis air outlet included in the at least one first chassis air outlet; and
push a second portion of the first air past the at least one first heat dissipation device and out of the chassis via the second chassis air outlet included in the at least one first chassis air outlet;
a second fan device that is located in the chassis housing opposite the at least one heat producing component from the first fan device and adjacent the at least one second heat dissipation device and at least one second chassis air inlet defined by the chassis, wherein the second fan device is configured to:
pull second air from outside of the chassis into the second fan device via the at least one second chassis air inlet; and
push the second air past the at least one second heat dissipation device and out of the chassis via the at least one second chassis air outlet; and
a third fan device that is located in the chassis housing opposite the at least one heat producing component from the first fan device and adjacent the at least one second heat dissipation device and at least one third chassis air inlet defined by the chassis, wherein the third fan device is configured to:
pull third air from the outside of the chassis into the third fan device via the at least one third chassis air inlet;

push a first portion of the third air past the at least one second heat dissipation device and out of the chassis via the at least one second chassis air outlet; and
push a second portion of the third air into the chassis housing.

2. The system of claim 1,
further comprising:
a gasketing system that is included in the chassis and that defines a positive pressure zone that is generated when the third fan device pushes the second portion of the third air into the chassis housing.

3. The system of claim 1, wherein the second fan device is located adjacent the first chassis wall on the chassis that defines a first chassis air outlet that is included in the at least one second chassis air outlet, and adjacent a third chassis wall on the chassis that defines a second chassis air outlet that is included in the at least one second chassis air outlet and that is oriented substantially perpendicularly to the first chassis wall, and wherein the second fan device is configured to:
push a first portion of the second air past the at least one second heat dissipation device and out of the chassis via the first chassis air outlet included in the at least one second chassis air outlet; and
push a second portion of the second air past the at least one second heat dissipation device and out of the chassis via the second chassis air outlet included in the at least one second chassis air outlet.

4. The system of claim 3, wherein the third fan device is located adjacent the third chassis wall on the chassis that defines a third chassis air outlet that is included in the at least one second chassis air outlet, and wherein the third fan device is configured to:
push the first portion of the third air past the at least one second heat dissipation device and out of the chassis via the third chassis air outlet.

5. The system of claim 1, further comprising:
a fourth fan device that is located in the chassis housing opposite the at least one heat producing component from the second fan device and the third fan device, and adjacent the at least one first heat dissipation device and the at least one first chassis air inlet, wherein the fourth fan device is configured to:
pull fourth air from the outside of the chassis into the fourth fan device via at least one fourth chassis air inlet defined by the chassis; and
push the fourth air past the at least one first heat dissipation device and out of the chassis via the at least one first chassis air outlet.

6. The system of claim 5, wherein the fourth fan device is configured to:
push a first portion of the fourth air past the at least one first heat dissipation device and out of the chassis via the at least one first chassis air outlet; and
push a second portion of the fourth air into the chassis housing.

7. An Information Handling System (IHS), comprising:
a chassis;
a processing system that is housed in the chassis;
a memory system that is housed in the chassis and coupled to the processing system;
at least one first heat dissipation device that is thermally coupled to the processing system and the memory system and located in the chassis adjacent the processing system and the memory system, and at least one second heat dissipation device that is thermally coupled to the processing system and the memory system and located in the chassis opposite the processing system and the memory system from the at least one first heat dissipation device;
a first fan device that is located in the chassis adjacent the at least one first heat dissipation device, wherein the first fan device is configured to:
  pull first air from outside of the chassis into the first fan device via at least one first chassis air inlet defined by the chassis;
  push a first portion of the first air past the at least one first heat dissipation device and out of the chassis via a first chassis air outlet defined on a first chassis wall on the chassis; and
  push a second portion of the first air past the at least one first heat dissipation device and out of the chassis via a second chassis air outlet defined on a second chassis wall on the chassis that is oriented substantially perpendicularly to the first chassis wall;
a second fan device that is located in the chassis opposite the processing system and the memory system from the first fan device and adjacent the at least one second heat dissipation device, wherein the second fan device is configured to:
  pull second air from outside of the chassis into the second fan device; and
  push the second air past the at least one second heat dissipation device and out of the chassis; and
a third fan device that is located in the chassis opposite the processing system and the memory system from the first fan device and adjacent the at least one second heat dissipation device, wherein the third fan device is configured to:
  pull third air from the outside of the chassis into the third fan device;
  push a first portion of the third air past the at least one second heat dissipation device and out of the chassis; and
  push a second portion of the third air into the chassis.

8. The IHS of claim 7, further comprising:
a board that supports the processing system and the memory system, wherein the board includes a first portion that is located between the first fan device and the second fan device and that includes a first width, and a second portion that extends from the first portion, that is located adjacent the third fan device, and that includes a second width that is greater than the first width.

9. The IHS of claim 7, wherein the second fan device is located adjacent a third chassis air outlet that is defined by the chassis, and adjacent a fourth chassis air outlet that is defined by the chassis and that is oriented substantially perpendicularly to the third chassis air outlet, and wherein the second fan device is configured to:
  push a first portion of the second air past the at least one second heat dissipation device and out of the chassis via the third chassis air outlet; and
  push a second portion of the second air past the at least one second heat dissipation device and out of the chassis via the fourth chassis air outlet.

10. The IHS of claim 9, wherein the third fan device is located adjacent a fifth chassis air outlet that is defined by the chassis adjacent the fourth chassis air outlet, and wherein the third fan device is configured to:
  push the first portion of the third air past the at least one second heat dissipation device and out of the chassis via the fifth chassis air outlet.

11. The IHS of claim 7, further comprising:
a fourth fan device that is located in the chassis opposite the processing system and the memory system from the second fan device and the third fan device and adjacent the at least one first heat dissipation device, wherein the fourth fan device is configured to:
  pull fourth air from the outside of the chassis into the fourth fan device; and
  push the fourth air past the at least one first heat dissipation device and out of the chassis.

12. The IHS of claim 11, wherein the fourth fan device is configured to:
  push a first portion of the fourth air past the at least one first heat dissipation device and out of the chassis; and
  push a second portion of the fourth air into the chassis.

13. The IHS of claim 7, further comprising:
a gasketing system that is included in the chassis and that defines a positive pressure zone that is generated when the third fan device pushes the second portion of the third air into the chassis.

14. A method for cooling a computing device, comprising:
pulling, by a first fan device that is located in a chassis adjacent at least one first heat dissipation device that is included in the chassis and that is thermally coupled to at least one heat producing component that is included in the chassis, first air from outside the chassis into the first fan device via at least one first chassis air inlet defined by the chassis;
pushing, by the first fan device, a first portion of the first air past the at least one first heat dissipation device and out of the chassis via a first chassis air outlet defined on a first chassis wall on the chassis;
pushing, by the first fan device, a second portion of the first air past the at least one first heat dissipation device and out of the chassis via a second chassis air outlet defined on a second chassis wall on the chassis that is oriented substantially perpendicularly to the first chassis wall;
pulling, by a second fan device that is located in the chassis opposite the at least one heat producing component from the first fan device and adjacent at least one second heat dissipation device that is thermally coupled to the at least one heat producing component, second air from outside the chassis into the second fan device;
pushing, by the second fan device, the second air past the at least one second heat dissipation device and out of the chassis;
pulling, by a third fan device that is located in the chassis opposite the at least one heat producing component from the first fan device and adjacent the at least one second heat dissipation device, second air from the outside of the chassis into the second fan device;
pushing, by the third fan device, a first portion of the third air past the at least one second heat dissipation device and out of the chassis; and
pushing, by the third fan device, a second portion of the third air into the chassis.

15. The method of claim 14,
wherein the chassis includes board that supports the at least one heat producing component, includes a first portion that has a first width and that is located between the first fan device and the second fan device, and includes a second portion that extends from the first portion, that is located adjacent the third fan device, and that includes a second width that is greater than the first width.

16. The method of claim 14, further comprising:

pushing, by the second fan device, a first portion of the second air past the at least one second heat dissipation device and out of the chassis via a third chassis air outlet that is defined by the chassis; and pushing, by the second fan device, a second portion of the second air past the at least one second heat dissipation device and out of the chassis via a fourth chassis air outlet that is defined by the chassis and that is oriented substantially perpendicularly to the third chassis air outlet.

17. The method of claim 16, further comprising:

pushing, by the third fan device, a first portion of the third air past the at least one second heat dissipation device and out of the chassis via a fifth chassis air outlet that is defined by the chassis adjacent the fourth chassis air outlet.

18. The method of claim 14, further comprising:

pulling, by a fourth fan device that is located in the chassis opposite the at least one heat producing component from the second fan device and the third fan device and adjacent the at least one first heat dissipation device, fourth air from the outside of the chassis into the fourth fan device; and pushing, by the fourth fan device, the fourth air past the at least one first heat dissipation device and out of the chassis.

19. The method of claim 18, further comprising:

pushing, by the fourth fan device, a first portion of the fourth air past the at least one first heat dissipation device and out of the chassis; and pushing, by the fourth fan device, a second portion of the fourth air into the chassis.

20. The method of claim 14, further comprising:

generating, in response to the third fan device pushing the second portion of the third air into the chassis, a positive pressure zone in the chassis that is defined by a gasketing system.

\* \* \* \* \*